United States Patent
Paul et al.

(10) Patent No.: US 8,632,874 B2
(45) Date of Patent: Jan. 21, 2014

(54) DIELECTRIC MATERIALS, METHODS OF FORMING SUBASSEMBLIES THEREFROM, AND THE SUBASSEMBLIES FORMED THEREWITH

(75) Inventors: Sankar Paul, Bradford, CT (US); Scott D. Kennedy, Pomfret Center, CT (US); Dirk M. Baars, South Windsor, CT (US)

(73) Assignee: Rogers Corporation, Rogers, CT (US)

( * ) Notice: Subject to any disclaimer, the term of this patent is extended or adjusted under 35 U.S.C. 154(b) by 467 days.

(21) Appl. No.: 12/813,556

(22) Filed: Aug. 23, 2010

(65) Prior Publication Data
US 2010/0307803 A1 Dec. 9, 2010

Related U.S. Application Data

(63) Continuation-in-part of application No. 11/829,406, filed on Jul. 27, 2007.

(60) Provisional application No. 61/186,221, filed on Jun. 11, 2009, provisional application No. 60/821,710, filed on Aug. 8, 2006.

(51) Int. Cl.
  *B32B 25/02* (2006.01)
  *B32B 25/08* (2006.01)
  *H01L 49/00* (2006.01)

(52) U.S. Cl.
  USPC ........ 428/195.1; 428/334; 428/422; 428/521; 428/901

(58) Field of Classification Search
  None
  See application file for complete search history.

(56) References Cited

U.S. PATENT DOCUMENTS

| 4,874,826 A | 10/1989 | Sakamoto et al. |
| 4,954,185 A | 9/1990 | Kohm |
| 5,124,415 A | 6/1992 | Sakamotot et al. |
| 5,194,307 A | 3/1993 | Gardeski |
| 5,223,568 A | 6/1993 | Landi et al. |
| 5,310,820 A | 5/1994 | Nelissen et al. |
| 5,541,243 A | 7/1996 | Ohmura et al. |
| 5,569,545 A | 10/1996 | Yokono et al. |
| 5,571,609 A | 11/1996 | St. Lawrence et al. |
| 5,622,782 A | 4/1997 | Poutasse, III et al. |
| 5,629,098 A | 5/1997 | Poutasse et al. |
| 6,132,851 A | 10/2000 | Poutasse |

(Continued)

FOREIGN PATENT DOCUMENTS

| EP | 0707038 A1 | 9/1995 |
| GB | 2172892 A1 | 10/1986 |

(Continued)

OTHER PUBLICATIONS

The International Searching Authority, Communication in Cases for Which No Other Form is Applicable, PCT/US2010/038303, Date of Mailing: Feb. 16, 2011, 1 page.
JP2005105062 A; Publication date: Apr. 21, 2005, Abstract, 1 page.
The International Searching Authority, International Search Report, PCT/US2010/038303, Date of Mailing Feb. 15, 2011, 7 pages.
The International Searching Authority, Written Opinion, PCT/US2010/038303, Date of Mailing Feb. 15, 2011, 10 pages.

(Continued)

*Primary Examiner* — Ramsey Zacharia
(74) *Attorney, Agent, or Firm* — Cantor Colburn LLP

(57) ABSTRACT

A circuit subassembly, comprising a dielectric layer formed from a dielectric composition comprising, based on the total volume of the composition: about 15 to about 65 volume percent of a dielectric filler; and about 35 to about 85 volume percent of a thermosetting composition comprising: a poly (arylene ether), and a carboxy-functionalized polybutadiene or polyisoprene polymer.

21 Claims, 6 Drawing Sheets

(56) References Cited

U.S. PATENT DOCUMENTS

| | | | |
|---|---|---|---|
| 6,165,309 | A | 12/2000 | Burnell et al. |
| 6,352,782 | B2 | 3/2002 | Yeager et al. |
| 6,528,559 | B1 | 3/2003 | Nakacho et al. |
| 7,022,404 | B2 | 4/2006 | Sethumadhavan et al. |
| 7,090,924 | B2 | 8/2006 | Sharma et al. |
| 2001/0053450 | A1 | 12/2001 | Yeager et al. |
| 2005/0107497 | A1 | 5/2005 | Akaho |
| 2005/0112369 | A1 | 5/2005 | Ibbitson et al. |
| 2005/0159516 | A1 | 7/2005 | Kwon |
| 2005/0208278 | A1 | 9/2005 | Landi et al. |
| 2007/0077413 | A1* | 4/2007 | Amou et al. .................. 428/323 |
| 2008/0038528 | A1 | 2/2008 | Paul |
| 2009/0151984 | A1 | 6/2009 | Fujimura |

FOREIGN PATENT DOCUMENTS

| | | | |
|---|---|---|---|
| JP | 1026555 | A | 1/1989 |
| JP | 4258658 | A | 9/1992 |
| JP | 1997031220 | A | 2/1997 |
| JP | 1999012456 | A | 1/1999 |
| JP | 1999209568 | A | 8/1999 |
| JP | 2005105061 | A | 4/2005 |
| JP | 2007126605 | A | 5/2007 |
| JP | 2007302877 | A | 11/2007 |
| WO | 9957949 | A1 | 11/1999 |
| WO | 02/083328 | A1 | 10/2002 |
| WO | 03048249 | A1 | 6/2003 |
| WO | 2008/020984 | A2 | 2/2008 |
| WO | 2008/127970 | A2 | 10/2008 |
| WO | 2009/126366 | A2 | 10/2009 |
| WO | 2010/009381 | A1 | 1/2010 |

OTHER PUBLICATIONS

The International Bureau, Preliminary Report on Patentability, PCT/US2009/034058, International filing date: Feb. 13, 2009, 8 pages.
The International Searching Authority, International Search Report, PCT/US2010/038303, Date of mailing: Nov. 23, 2010.
The International Searching Authority, Written Opinion, PCT/US2010/038303, Date of mailing: Nov. 23, 2010, 10 pages.
DE 19650370 A1, Publication Date: Jun. 10, 1998, Abstract, 1 page.
International Searching Authority, International Search Report PCT/US2007/016987, Mailing date: Feb. 21, 2008, 6 pages.
International Searching Authority, International Search Report, PCT/US2009/034058, Date of mailing: Sep. 24, 2009, 7 pages.
International Searching Authority, Written Opinion, PCT/US2007/016987, Date of mailing: Feb. 21, 2008, 6 pages.
International Searching Authority, Written Opinion, PCT/US2009/034058, Date of mailing: Sep. 24, 2009, 7 pages.
JP2001127444 A, Publication date: May 11, 2001, Abstract, 1 page.
JP2001329147 A, Publication date: Nov. 27, 2001, Abstract, 1 page.
JP2001339131 A, Publication date: Dec. 7, 2001, Abstract, 1 page.
JP2004091533 A, Publication date: Mar. 25, 2004, Abstract, 1 page.
JP2005060489 A, Publication date: Mar. 10, 2005, Abstract, 1 page.
JP2005336426 A, Publication date: Dec. 8, 2005, Abstract, 1 page.
JP2006051687 A, Publication date: Feb. 23, 2006, Abstract, 1 page.
JP2006205694 A, Publication date: Aug. 10, 2006, Abstract, 1 page.
JP2007021763 A, Publication date: Feb. 1, 2007, Abstract, 1 page.
JP2008208778 A. Publication date: Sep. 11, 2008, Abstract, 1 page.
JP2009001728 A, Publication date: Jan. 8, 2009, Abstract, 1 page.
JP 09-001728 A, Date of Publication: Jan. 7, 1997, Abstract, 1 page.
JP 2003-283098, Date of publication: Oct. 3, 2003, Abstract, 1 page.
JP 2004-307761, Date of publication: Nov. 4, 2004, Abstract, 1 page.
JP 2005-248147, Date of publication: Sep. 15, 2005, Abstract, 1 page.

* cited by examiner

DIELECTRIC MATERIALS, METHODS OF FORMING SUBASSEMBLIES THEREFROM, AND THE SUBASSEMBLIES FORMED THEREWITH

CROSS REFERENCE TO RELATED APPLICATION

This application claims the benefit of U.S. Provisional Application No. 61/186,221 filed on Jun. 11, 2009, which is a continuation-in-part of U.S. application Ser. No. 11/829,406 filed on Jul. 27, 2007, which claims the benefit of U.S. Provisional Application No. 60/821,710 filed Aug. 8, 2006, all of which are incorporated herein by reference in their entirety.

BACKGROUND

This invention generally relates to polymeric dielectric materials, methods of forming circuit subassemblies and circuits that include the polymeric dielectric materials, and the subassemblies and circuits formed thereby.

Polymeric dielectric materials are in wide use in the manufacture of electronic circuits. The polymeric dielectric materials are often supplied to the circuit or device manufacturer as a layer in the form of a circuit subassembly. Such subassemblies are used in many semiconductor packaging applications, such as integrated circuit (IC) substrates, radio frequency (RF) systems, and high-speed digital systems. For example, the circuitry of an IC chip (e.g., a microprocessor, a random access memory, a microcontroller, an application specific integrated circuit, and the like) is typically connected to another element of circuitry through interconnect structures, such as an interposer, substrate, and/or board. To make electronic equipment smaller, faster, lighter, and less expensive, high-density interconnect structures are fabricated to accommodate a large number of conductor paths per unit area. The high-density interconnect structure not only miniaturizes the footprint of the IC package, but also can improve signal integrity, such as noise reduction and low attenuation. One way of producing high-density interconnect structures is using a sequential buildup (SBU) method to produce a circuit subassembly, in particular an SBU circuit subassembly.

Conventional SBU circuit subassemblies have two distinct elements: a core and buildup layers. The core can comprise a layer of a dielectric substrate (e.g., a glass-reinforced epoxy resin as used in printed circuit boards (PCBs)), a conductive metal layer (e.g., copper or aluminum), a ceramic layer, a core adhesive layer, or a PCB comprising a dielectric layer and at least one, specifically two, conductive circuit layers disposed on opposite sides of the dielectric layer or a multilayer PCB having more than 1 dielectric layer and more than two conductive layers. The SBU process typically begins with the core, which serves as the carrier for fabricating the buildup layers and provides mechanical support. The buildup layers, consisting of dielectric layers and wiring layers, are sequentially stacked up alternately on one or both surfaces of the core substrate. The wiring layers consist of a plurality of circuitry patterns that provide various wiring functions. Interlayer connection is provided by laser formed or photo defined conductive vias. In order to interconnect the buildup layers on one side of the core to those on the other side, through-holes in the core substrate are mechanically and/or laser drilled or punched and the holes are plated or conductor filled using standard PCB techniques.

"Circuit subassemblies" as used herein further includes other types of subassemblies, for example bond plies, resin coated conductive layers, unclad dielectric substrate layers, cover films, and circuit laminates. A circuit laminate has a conductive layer, e.g., copper, fixedly attached to the cured polymeric dielectric layer. Double clad circuit laminates have two conductive layers, one on each side of the polymeric dielectric layer. Patterning a conductive layer of a laminate, for example by etching, provides a circuit. Multilayer circuits comprise a plurality of conductive layers, at least one of which contains a conductive wiring pattern. Typically, multilayer circuits are formed by laminating one or more circuits together using bond plies, by building up additional layers with resin coated conductive layers that are subsequently etched, or by building up additional layers by adding unclad dielectric layers followed by additive metallization. On lamination, the uncured or B-staged (partially cured) bond plies, resin coated conductive layers, and buildup layers are cured. After forming the multilayer circuit, known hole-forming and plating technologies can be used to produce useful electrical pathways between conductive layers.

Conventional vertically integrated interconnect circuit subassemblies are composed of distinct circuit subassemblies known as subcomposites. There are typically two types of subcomposites: joining core subcomposites and signal core subcomposites. Both types of subcomposites comprise a conductive power layer disposed between two dielectric layers. A plurality of through-holes can be formed in the subcomposites. For the signal core subcomposites, wiring layers are then disposed on the dielectric layers using a semi-additive process. In the joining core subcomposites, the through-holes are then plated with conducting metal and/or filled with an electrically conductive paste. The subcomposites are aligned on top of one another and adhered or laminated together to form the subassembly. The plated metal and/or electrically conductive paste then forms conductive joints between the joining core subcomposites and the signal core subcomposites, thereby providing multiple electrical pathways through the vertically integrated interconnect subassembly. The subassembly can provide for a higher wiring density than capable in SBU subassemblies by the nature of the z-axis electrical interconnections within the subassembly.

Dielectric materials suitable for use in the above-described circuit subassemblies and circuit materials must meet a variety of stringent requirements. In particular, the demand for smaller and less costly electronics operating in multi-band frequency continues to grow. In some cases, IC packaging has become a bar to achieving further reductions in semiconductor size and increases in frequency. Higher frequencies require dielectric materials with very low loss (Df, also known as loss tangent and dissipation factor). Low loss materials contribute very little to the attenuation of the electrical signal during its transmission properties, which can in turn reduce the IC power requirements and peak junction temperatures. However, conventional dielectric materials can have relatively high loss at the higher (e.g., gigahertz) frequencies. For example, a commonly used buildup dielectric film, type GX13 from Ajinomoto, has a loss of 0.019 at 5.8 GHz (Ajinomoto data sheet on ABF materials dated June 2007), which level can be problematic for many high frequency/high speed applications. In addition, absorbed water in the buildup dielectric can have adverse effects on electrical properties, especially in increasing loss, and thereby creating electrical reliability problems. Therefore, a dielectric material with very low water absorption is desired for present and future buildup applications. The aforementioned GX13 buildup dielectric film has a water absorption of greater than 1% which is unacceptable for many high frequency/high speed applications. Such high water absorption also can lead to thermal reliability problems. Further, the capacitance density of conventional dielectric materials can change as a function of frequency and temperature, which can affect the performance of the package.

Also, the dielectric layers function in part to absorb any thermal or mechanical stresses that occur as a result of coefficient of thermal expansion (CTE) mismatches between the package and the core, or between layers in a core. Ideal dielectric materials for higher performance applications, therefore, generally have a low CTE, combined with low modulus and high elongation, to provide a subassembly that is less likely to be affected by the warping and handling problems that can be associated with CTE mismatches. Other desirable properties for high performance buildup layers include good high temperature stability; good thermal conductivity (heat dissipation), low z-axis CTE, and controlled melt flow. The last is critical in buildup dielectric layers' processing and use.

Dielectric materials in present use, such as the afore-mentioned GX13, have many of the desired properties sought for buildup applications, but do not meet all the desired needs for increasing high frequency/high speed applications. These materials suffer especially from having dielectric loss and water absorption considerably higher than desired and high temperature thermal performance less than desired.

There accordingly remains a need in the art for dielectric materials for use in the manufacture of circuit subassemblies and circuits with a combination of low loss at high frequencies, low water absorption, good high temperature stability, and good mechanical properties. It would be a further advantage if the materials had excellent flame retardance in the absence of halogenated flame retardants, and high thermal conductivity.

SUMMARY OF INVENTION

In one embodiment, a circuit subassembly comprises a dielectric layer formed from a dielectric composition comprising, based on the total volume of the composition: about 15 to about 65 volume percent of a dielectric filler; and about 35 to about 85 volume percent of a thermosetting composition comprising: a poly(arylene ether), and a carboxy-functionalized polybutadiene or polyisoprene polymer. The circuit subassembly can be used as a buildup layer, a core adhesive layer in a multilayer core, a resin-coated conductive layer, a dielectric layer in a circuit laminate, and other materials and subassemblies.

In another embodiment, a sequential buildup subassembly comprises a core, wherein the core comprises a dielectric substrate layer having a first surface and an opposite second surface, and a first core wiring layer disposed on the first surface of the dielectric substrate layer; and a first dielectric buildup layer having a thickness of about 5 to about 100 micrometers disposed on the first core wiring layer, wherein the dielectric buildup layer is formed from the above-described dielectric composition.

In yet another embodiment, a core for a sequential buildup subassembly comprises a first circuit and a second circuit; and an adhesive layer disposed between the first circuit and the second circuit, wherein the adhesive is formed from the above-described dielectric composition.

In still another embodiment, a multilayer circuit comprises a first circuit comprising a first dielectric layer and a first wiring layer disposed thereon; a second circuit comprising a second dielectric layer and a second wiring layer disposed thereon; and an adhesive layer disposed between the first wiring layer of the first circuit and the second wiring layer of the second circuit, wherein the first, dielectric layer, the second dielectric layer, or both are formed from the above-described dielectric composition.

Other embodiments include a vertically integrated interconnect subassembly, comprising: a joining core subcomposite, wherein the subcomposite comprises a first dielectric layer; a second dielectric layer, and a power layer disposed between the first dielectric layer and the second dielectric layer, wherein a selected one or both of the first and the second dielectric layers are formed from the dielectric composition.

Methods for the manufacture of a circuit subassembly, sequential buildup assembly, core for a sequential buildup assembly, multilayer circuit, and a vertically integrated interconnect subassembly are also described.

The invention is further illustrated by the following drawings, detailed description, and examples.

BRIEF DESCRIPTION OF DRAWINGS

Referring now to the exemplary drawings wherein like elements are numbered alike in the several figures.

DETAILED DESCRIPTION

Figure 1:
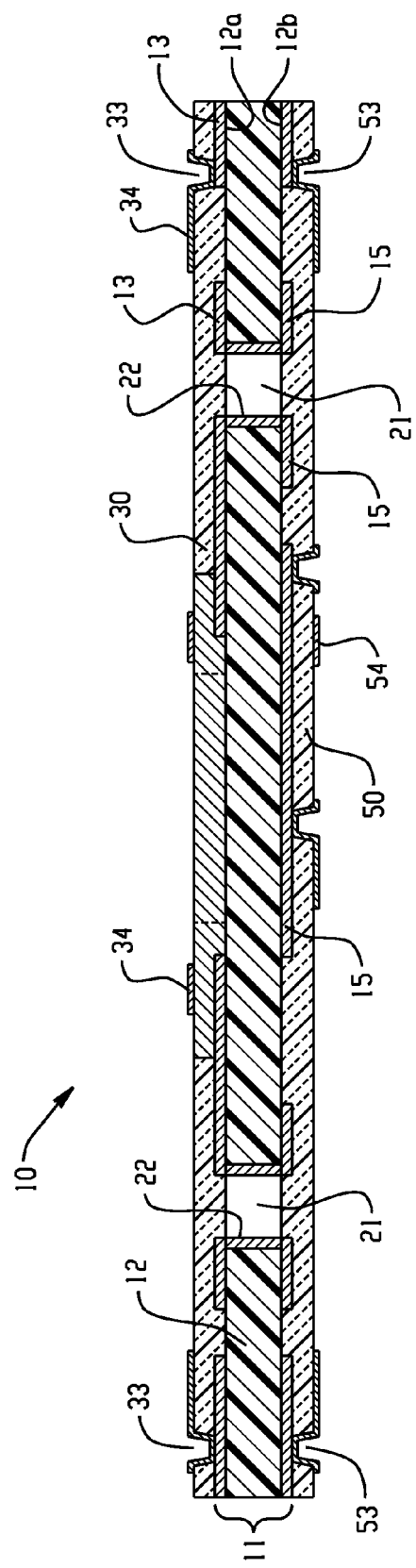
FIG. 1 shows an exemplary embodiment of a sequential buildup circuit subassembly.

Disclosed herein are dielectric compositions useful in the manufacture of circuit subassemblies and the circuits formed therefrom. The dielectric compositions comprise at least 15 weight percent (wt. %) of a dielectric filler in a thermosetting composition comprising a poly(arylene ether), a polybutadiene or polyisoprene polymer, preferably a carboxylated polybutadiene or polyisoprene polymer, and optionally, an elastomeric block copolymer comprising units derived from an alkenyl aromatic compound and a conjugated diene. The poly(arylene ether) can also optionally be carboxy-functionalized. The combination of these components provides improved dielectric compositions for use in a wide variety of circuit subassemblies, including cores and/or a buildup layers in SBU circuit subassemblies, subcomposites of vertically integrated interconnect circuit subassemblies, and bond plies, resin coated conductive layers, dielectric substrates, and cover films in printed wiring boards and other types of circuits. Such circuit subassemblies are compatible with high frequency and high switching speed ICs. Further, the cured dielectric compositions have low moisture absorption, and desirable mechanical properties, and can be halogen-free, and still achieve a UL 94 rating of V-0.

The dielectric compositions accordingly address the higher performance needs required by current semiconductor packaging applications. For example, the dielectric materials (i.e., the fully cured dielectric compositions) have lower dielectric loss at high frequencies (e.g., at 10 GHz), and higher thermal stability than dielectric materials currently used in SBU subassemblies (e.g., the Ajinomoto type GX13). The lower dielectric loss enables the SBU subassemblies to be employed in higher frequency applications. The higher thermal stability of the dielectric material allows the material to be exposed to high temperature operations such as soldering and wire bonding without deformation or blistering occurring.

It has been further found that the dielectric materials can be manufactured to be high in dielectric constant (Dk) e.g., from about 5 to about 12 at 10 GHz, thus making them suitable for use as a dielectric layer and/or a core adhesive layer in SBU subassemblies used with high frequency capacitors and inductors. Moreover, the higher Dk dielectric materials can also be used as build-up layers in SBU subassemblies including those having higher Dk cores and/or core adhesive layers.

It has been found by the inventors hereof that a key factor in the manufacture of dielectric compositions having the foregoing properties, in addition to good processing characteristics, is the selection of the type, size, and quantity of filler present in the dielectric composition. These factors are each important in adjusting the properties of the dielectric composition, including flow upon lamination, flame resistance, CTE, thermal conductivity, Dk, Df, modulus and elongation. Often, a combination of fillers is used to obtain the desired balance of properties.

Exemplary fillers for use in the dielectric composition include titanium dioxide (rutile and anatase), barium titanate, strontium titanate, silica, including fused amorphous silica, corundum, wollastonite, aramide fibers (e.g., KEVLAR™ from DuPont), fiberglass, $Ba_2Ti_9O_{20}$, glass spheres, quartz, boron nitride, aluminum nitride, silicon carbide, beryllia, alumina, magnesia, magnesium hydroxide, melamine polyphosphate, melamine cyanurate, Melam, Melon, Melem, guanidines, phosphazenes, silazanes, DOPO (9,10-dihydro-9-oxa-10 phosphenathrene-10-oxide), DOPO (10-5 dihydroxyphenyl, 10-H-9 oxaphosphaphenanthrenelo-oxide), mica, talcs, nanoclays, aluminosilicates (natural and synthetic), and fumed silicon dioxide (e.g., Cab-O-Sil, available from Cabot Corporation), used alone or in combination. Specific fillers include rutile titanium dioxide, surface treated/coated magnesium hydroxide and amorphous silica.

The fillers can be in the form of solid, porous, or hollow particles. The particle size of the filler affects a number of important properties including rheology prior to and during cure, maximum packing fraction, coefficient of thermal expansion, modulus, elongation, and flame resistance. In one embodiment, the filler has an average particle size of 0.1 to 15 micrometers, specifically 0.2 to 10 micrometers. A combination of fillers having a bimodal, trimodal, or higher average particle size distribution can be used.

To improve adhesion between the fillers and polymer, the filler can be treated with one or more coupling agents, such as silanes, zirconates, or titanates. The filler can be pretreated, or the coupling agent can be added to the thermosetting composition as described in further detail below.

The dielectric compositions comprise at least 15 volume percent (vol %) of the filler composition, with the remainder being a thermosetting composition. The particular amount of filler and choice of fillers depends on the intended use of the dielectric composition, and is adjusted to obtain the desired balance of properties. In any case, the inventors have found that at least 15 vol % of filler is required to achieve acceptable coefficient of thermal expansion in the dielectric composition. Further, by choosing proper filler types, particle size distribution and loading level above the 15 vol % minimum, an overall desirable balance of properties can be achieved for many applications.

The dielectric compositions further comprise a thermosetting composition. The thermosetting compositions comprise a poly(arylene ether), which can be in the form of a homopolymer or a copolymer, including a graft or a block copolymer. Combinations of various forms can be used. Poly(arylene ether)s comprise a plurality of structural units of formula (1):

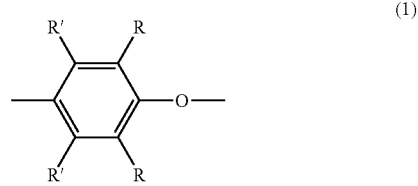

wherein for each structural unit, each R and R' is independently hydrogen, halogen, primary or secondary $C_{1-7}$ alkyl, phenyl, $C_{1-7}$ aminoalkyl, $C_{1-7}$ alkenylalkyl, $C_{1-7}$ alkynylalkyl, $C_{1-7}$ alkoxy, $C_{6-10}$ aryl, and $C_{6-10}$ aryloxy. In some embodiments, each R is independently $C_{1-7}$ alkyl or phenyl, for example, $C_{1-4}$ alkyl, and each R' is independently hydrogen or methyl.

Exemplary poly(arylene ether)s include poly(2,6-dimethyl-1,4-phenylene ether), poly(2,6-diethyl-1,4-phenylene ether), poly(2,6-dipropyl-1,4-phenylene ether), poly(2-methyl-6-allyl-1,4-phenylene ether), poly(di-tert-butyl-dimethoxy-1,4-phenylene ether), poly(2,6-dichloromethyl-1,4-phenylene ether, poly(2,6-dibromomethyl-1,4-phenylene ether), poly(2,6-di(2-chloroethyl)-1,4-phenylene ether), poly(2,6-ditolyl-1,4-phenylene ether), poly(2,6-dichloro-1,4-phenylene ether), poly(2,6-diphenyl-1,4-phenylene ether), and poly(2,5-dimethyl-1,4-phenylene ether). A useful poly(arylene ether) comprises 2,6-dimethyl-1,4-phenylene ether units, optionally in combination with 2,3,6-trimethyl-1,4-phenylene ether units.

The poly(arylene ether) can be functionalized so as to provide a functional group that enhances adhesion between the conductive metal used to form the wiring layer and the dielectric layer and can improve other processing and performance properties. Functionalization can be accomplished using a polyfunctional compound having in the molecule either or both (i) a carbon-carbon double bond or a carbon-carbon triple bond, and (ii) one or more of a carboxy group, including a carboxylic acid, anhydride, amide, ester, or acid halide. In one embodiment the functional group is a carboxylic acid or ester group. Examples of polyfunctional compounds that can provide a carboxylic acid functional group include maleic acid, maleic anhydride, fumaric acid, and citric acid.

In particular, suitable functionalized poly(arylene ether)s include the reaction product of a poly(arylene ether) and a cyclic carboxylic acid anhydride. Examples of suitable cyclic anhydrides are maleic anhydride, succinic anhydride, glutaric anhydride, adipic anhydride, and phthalic anhydride, more specifically, maleic anhydride or methacrylic anhydride. Modified poly(arylene ethers) such as maleinized poly (arylene ethers) can be produced by methods as described in U.S. Pat. No. 5,310,820, or are commercially available. Examples of commercially available suitable modified and unmodified poly(arylene ethers) include PPE-MA from Asahi (a maleinized poly(arylene ether)), and Blendex HPP820 from Chemtura (an unmodified poly(arylene ether)).

Alternatively, suitable functionalized poly(arylene ether)s include the reaction product of poly(arylene ether) and a styrene containing compound such that after reaction there are unreacted double bonds in the resulting polymer.

The thermosetting compositions further comprise a polybutadiene or polyisoprene polymer. A "polybutadiene or polyisoprene polymer" as used herein includes homopolymers derived from butadiene, homopolymers derived from isoprene, and copolymers derived from butadiene and/or isoprene and/or less than 50 weight percent (wt %) of a monomer co-curable with the butadiene and/or isoprene. Suitable monomers co-curable with butadiene and/or isoprene include monoethylenically unsaturated compounds such as acrylonitrile, ethacrylonitrile, methacrylonitrile, alpha-chloroacrylonitrile, beta-chloroacrylonitrile, alpha-bromoacrylonitrile, $C_{1-6}$ alkyl (meth)acrylates (for example, methyl(meth)acrylate, ethyl(meth)acrylate, n-butyl(meth)acrylate, n-propyl (meth)acrylate, and isopropyl(meth)acrylate), acrylamide, methacrylamide, maleimide, N-methyl maleimide, N-ethyl maleimide, itaconic acid, (meth)acrylic acid, alkenyl aromatic compounds as described below, and combinations comprising at least one of the foregoing monoethylenically unsaturated monomers.

The co-curable polybutadiene or polyisoprene polymer used in the thermosetting composition can be co-curable with the poly(arylene ether). In one embodiment, the polybutadiene or polyisoprene polymer is carboxy-functionalized. Functionalization can be accomplished using a polyfunctional compound having in the molecule both (i) a carbon-carbon double bond or a carbon-carbon triple bond, and (ii) one or more of a carboxy group, including a carboxylic acid, anhydride, amide, ester, or acid halide. A preferred carboxy group is a carboxylic acid or ester. Examples of polyfunctional compounds that can provide a carboxylic acid functional group include maleic acid, maleic anhydride, fumaric acid, and citric acid. In particular, polybutadienes adducted with maleic anhydride can be used in the thermosetting composition. Suitable maleinized polybutadiene polymers are commercially available, for example from Sartomer under the trade names RICON 130MA8, RICON 130MA13, RICON 130MA20, RICON 131MA5, RICON 131MA10, RICON 131MA17, RICON 131MA20, and RICON 156MA17. Suitable maleinized polybutadiene-styrene copolymers are commercially available, for example, from Sartomer under the trade names RICON 184MA6. RICON 184MA6 is a butadiene-styrene copolymer adducted with maleic anhydride having styrene content from 17 to 27 wt % and number average molecular weight (Mn) of about 9,900 g/mole.

In still other embodiments, the thermosetting compositions further comprise an elastomeric polymer. The elastomeric polymer can be co-curable with the poly(arylene ether) and/or the polybutadiene or isoprene resin. Suitable elastomers include elastomeric block copolymers comprising a block (A) derived from an alkenyl aromatic compound and a block (B) derived from a conjugated diene. The arrangement of blocks (A) and (B) includes linear and graft structures, including radial teleblock structures having branched chains. Examples of linear structures include diblock (A-B), triblock (A-B-A or B-A-B), tetrablock (A-B-A-B), and pentablock (A-B-A-B-A or B-A-B-A-B) structures as well as linear structures containing 6 or more blocks in total of A and B. Specific block copolymers include diblock, triblock, and tetrablock structures, and specifically the A-B diblock and A-B-A triblock structures.

The alkenyl aromatic compound providing the block (A) is represented by formula (2):

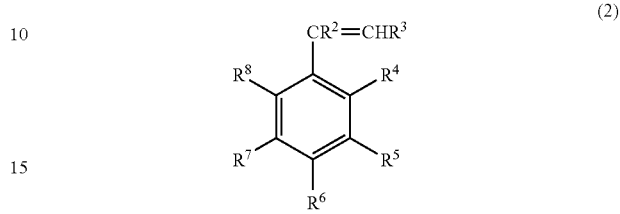

wherein each of $R^2$ and $R^3$ is independently hydrogen, $C_1$-$C_5$ alkyl, bromo, or chloro, and each of $R^4$, $R^5$, $R^6$, $R^7$, and $R^8$ is independently hydrogen, $C_1$-$C_{12}$ alkyl, $C_3$-$C_{12}$ cycloalkyl, $C_6$-$C_{12}$ aryl, $C_7$-$C_{12}$ aralkyl, $C_7$-$C_{12}$ alkaryl, $C_1$-$C_{12}$ alkoxy, $C_3$-$C_{12}$ cycloalkoxy, $C_6$-$C_{12}$ aryloxy, chloro, bromo, or hydroxy. Exemplary alkenyl aromatic compounds include styrene, 3-methylstyrene, 4-methylstyrene, 3,5-diethylstyrene, 4-n-propylstyrene, alpha-methylstyrene, alpha-methyl vinyltoluene, alpha-chlorostyrene, alpha-bromostyrene, dichlorostyrene, dibromostyrene, tetra-chlorostyrene, and the like, and combinations comprising at least one of the foregoing compounds. Styrene and/or alpha-methylstyrene are often used.

Specific examples of the conjugated dienes used to provide block (B) include 1,3-butadiene, 2-methyl-1,3-butadiene (isoprene), 2,3-dimethyl-1,3-butadiene, and 1,3-pentadiene, specifically 1,3-butadiene and isoprene. A combination of conjugated dienes can be used. The block (B) derived from a conjugated diene is optionally partially or fully hydrogenated.

Exemplary block copolymers comprising a block (A) derived from an alkenyl aromatic compound and block (B) derived from a conjugated diene include styrene-butadiene diblock copolymer (SB), styrene-butadiene-styrene triblock copolymer (SBS), styrene-isoprene diblock copolymer (SI), styrene-isoprene-styrene triblock copolymer (SIS), styrene-(ethylene-butylene)-styrene triblock copolymer (SEBS), styrene-(ethylene-propylene)-styrene triblock copolymer (SEPS), and styrene-(ethylene-butylene) diblock copolymer (SEB). Such polymers are commercially available, for example from Shell Chemical Corporation under the trade names KRATON D-1101, KRATON D-1102, KRATON D-1107, KRATON D-1111, KRATON D-1116, KRATON D-1117, KRATON D-1118, KRATON D-1119, KRATON D-1122, KRATON D-1135X, KRATON D-1184, KRATON D-1144X, KRATON D-1300X, KRATON D-4141, KRATON D-4158, KRATON G1726, and KRATON G-1652. KRATON D-1118 is a solid SB-SBS copolymer. This copolymer has polystyrene end blocks and a rubbery polybutadiene mid-block with about 20% SBS triblock and about 80% SB diblock. It is a low modulus, low cohesive strength, soft rubber.

The relative amount of the poly(arylene ether), the polybutadiene or polyisoprene polymer, and the elastomeric block copolymer will depend on the intended use of the dielectric composition (e.g., whether used in a core, in a buildup layer, etc.) and on the desired properties. It has been found that use of a poly(arylene ether) provides increased bond strength between a conductive metal layer, particularly copper, and a relatively nonpolar dielectric substrate material. This result is particularly surprising since poly(arylene ether)s are themselves nonpolar. Use of a polybutadiene or polyisoprene polymer further increases the high temperature resistance of the dielectric materials, particularly when these polymers are carboxy-functionalized Use of an elastomeric block copolymer may function to compatibilize the components of the dielectric materials. Determination of the appropriate quantities of each component can be done without undue experimentation, using the guidance provided herein.

In one embodiment, the thermosetting composition comprises up to 100 wt % of the poly(arylene ether), specifically the carboxy-functionalized poly(arylene ether). In another embodiment, the thermosetting composition consists essentially of up to 100 wt % of the poly(arylene ether), specifically the carboxy-functionalized poly(arylene ether).

In still another embodiment, the thermosetting composition comprises up to 100 wt. % of the styrenated poly(arylene ether). Alternatively, the thermosetting composition consists essentially of up to 100 wt % of the styrenated poly(arylene ether).

The thermosetting composition can alternatively comprise about 20 to about 99 wt %, specifically about 30 to about 80 wt %, more specifically about 40 to about 60 wt % of the poly(arylene ether), preferably the carboxy-functionalized poly(arylene ether) or the styrenated poly(arylene ether), and about 1 to about 80 wt %, specifically 11 to about 70 wt %, more specifically about 20 to about 70 wt %, still more specifically about 40 to about 60 wt % of the polybutadiene or polyisoprene polymer, preferably the carboxy-functionalized polybutadiene or polyisoprene polymer, each of the foregoing amounts being based on the total weight of the thermosetting composition.

In still another embodiment, the thermosetting composition comprises about 20 to about 98 wt %, specifically about 25 to about 75 wt %, more specifically about 30 to about 50 wt % of the poly(arylene ether), preferably the carboxy-functionalized poly(arylene ether); about 1 to about 79 wt %, specifically about 10 to about 60 wt %, more specifically about 20 to about 40 wt % of the co-curable polybutadiene or polyisoprene polymer, preferably the co-curable carboxy-functionalized polybutadiene or polyisoprene polymer; and about 1 to about 79 wt %, specifically about 10 to about 60 wt %, more specifically about 20 to about 40 wt % of the elastomeric block copolymer, each based on the total weight of the thermosetting composition.

In addition to the one or more of the polymers described above, the dielectric composition can further optionally comprise additives such as cure initiators, crosslinking agents, viscosity modifiers, coupling agents, wetting agents, flame retardants, fillers, antioxidants, and coupling agents. The particular choice of additives depends upon the particular application of the dielectric material, and the desired properties for that application, and are selected so as to enhance or not substantially adversely affect the electrical properties of the circuit subassemblies, such as dielectric constant, dissipation factor, dielectric loss, and/or other desired properties.

Exemplary cure initiators include those useful in initiating cure (cross-linking) of the polymers, in the dielectric composition. Examples include, but are not limited to, azides, peroxides, sulfur, and sulfur derivatives. Free radical initiators are especially desirable as cure initiators. Examples of free radical initiators include peroxides, hydroperoxides, and non-peroxide initiators such as 2,3-dimethyl-2,3-diphenyl butane. Examples of peroxide curing agents include dicumyl peroxide, alpha, alpha-di(t-butylperoxy)-m,p-diisopropylbenzene, 2,5-dimethyl-2,5-di(t-butylperoxy)hexane-3, and 2,5-dimethyl-2,5-di(t-butylperoxy)hexyne-3, and mixtures comprising one or more of the foregoing cure initiators. The cure initiator, when used, is typically present in an amount of about 0.1 wt % to about 5 wt %, based on the total weight of the dielectric composition.

Crosslinking agents are reactive monomers or polymers that increase the cross-link density upon cure of the dielectric material. In one embodiment, such reactive monomers or polymers are capable of co-reacting with a polymer in the adhesive polymer and a polymer in the circuit substrate composition. Examples of suitable reactive monomers include styrene, divinyl benzene, vinyl toluene, divinyl benzene, triallylcyanurate, diallylphthalate, and multifunctional acrylate monomers (such as Sartomer compounds available from Sartomer Co.), among others, all of which are commercially available. Useful amounts of crosslinking agents are about 0.1 to about 50 wt %, based on the total weight of the dielectric material composition.

Exemplary antioxidants include radical scavengers and metal deactivators. A non-limiting example of a free radical scavenger is poly[[6-(1,1,3,3-tetramethylbutyl)amino-s-triazine-2,4-dyil][(2,2,6,6,-tetramethyl-4-piperidyl)imino]hexamethylene[(2,2,6,6-tetramethyl-4-piperidyl)imino]], commercially available from Ciba Chemicals under the tradename Chimassorb 944. A non-limiting example of a metal deactivator is 2,2-oxalyldiamido bis[ethyl 3-(3,5-di-t-butyl-4-hydroxyphenyl)propionate] commercially available from Uniroyal Chemical (Middlebury, Conn.) under the tradename Naugard XL-1. A single antioxidant or a mixture of two or more antioxidants can be used. Antioxidants are typically present in amounts of up to about 3 wt %, specifically about 0.5 to about 2.0 wt %, based on the total weight of the dielectric composition.

Coupling agents can be present to promote the formation of or participate in covalent bonds connecting a metal surface or filler surface with a polymer. Exemplary coupling agents include 3-mercaptopropylmethyldimethoxy silane and 3-mercaptopropyltrimethoxy silane and hexamethylenedisilazanes. Coupling agents, when present, can be present in amounts of about 0.1 to about 2.0 wt %, based on the total weight of the dielectric composition.

The formulations can include flame retardant additives such as bromine, phosphorus, metal oxide containing flame retardants. Suitable bromine containing flame retardants are commercially available from, for example, Albemarle Corporation under trade names Saytex BT-93W (ethylenebistetrabromonaphthalamide), Saytex 120 (tetradecaboromodiphenoxybenzene), and Great Lake under trade name BC-52, BC-58, Esschem Inc under trade name FR1025. Suitable phosphorus containing flame retardants include various organic phosphorous-based compounds, for example an aromatic phosphate of the formula $(GO)_3P=O$, wherein each G is independently an $C_{1-36}$ alkyl, cycloalkyl, aryl, alkylaryl, or arylalkyl group, provided that at least one G is an aromatic group. Two of the G groups can be joined together to provide a cyclic group, for example, diphenyl pentaerythritol diphosphate. Other suitable aromatic phosphates can be, for example, phenyl bis(dodecyl)phosphate, phenyl bis(neopentyl)phosphate, phenyl bis(3,5,5'-trimethylhexyl)phosphate, ethyl diphenyl phosphate, 2-ethylhexyl di(p-tolyl)phosphate, bis(2-ethylhexyl)p-tolyl phosphate, tritolyl phosphate, bis(2-ethylhexyl)phenyl phosphate, tri(nonylphenyl)phosphate, bis(dodecyl)p-tolyl phosphate, dibutyl phenyl phosphate, 2-chloroethyl diphenyl phosphate, p-tolyl bis(2,5,5'-trimethylhexyl)phosphate, 2-ethylhexyl diphenyl phosphate, or the like. A specific aromatic phosphate is one in which each G is aromatic, for example, triphenyl phosphate, tricresyl phosphate, isopropylated triphenyl phosphate, and the like. Examples of suitable di- or polyfunctional aromatic phosphorous-containing compounds include resorcinol tetraphenyl diphosphate (RDP), the bis(diphenyl)phosphate of hydroquinone and the bix(diphenyl)phosphate of bisphenol-A, respectively, their oligomeric and polymeric counterparts, and the like. Metal phosphinate salts can also be used. Examples of phosphinates are phosphinate salts such as for example alicylic phosphinate salts and phosphinate esters. Further examples of phosphinates are diphosphinic acids, dimethylphosphinic acid, ethylmethylphosphinic acid, diethylphosphinic acid, and the salts of these acids, such as for example the aluminum salts and the zinc salts. Examples of phosphine oxides are isobutylbis(hydroxyalkyl) phosphine oxide and 1,4-diisobutylene-2,3,5,6-tetrahydroxy-1,4-diphosphine oxide or 1,4-diisobutylene-1,4-diphosphoryl-2,3,5,6-tetrahydroxycyclohexane. Further examples of phosphorous-containing compounds are NH1197® (Great Lakes), NH1511® (Great Lakes), NcendX P-30® (Albemarle), Hostaflam OP5500® (Clariant), Hostaflam OP910® (Clariant), EXOLIT 935 (Clariant), and Cyagard RF 1204®, Cyagard RF 1241® and Cyagard RF 1243R (Cyagard are products of Cytec Industries). In a particularly advantageous embodiment, a halogen-free version of the adhesion has excellent flame retardance when used with EXOLIT 935 (an aluminum phosphinate). Suitable metal oxide flame retardants are magnesium hydroxide, aluminum hydroxide, zinc stannate, boron oxide or the like.

The above-described dielectric materials have low dielectric loss, in particular a dissipation factor of less than or equal to about 0.02 measured at 10 gigahertz; specifically less than or equal to about 0.01 measured at 10 gigahertz; more specifically less than or equal to about 0.005 measured at 10 gigahertz.

The above-described dielectric materials also have a low CTE, specifically less than or equal to about 80 parts per million per degree Celsius (ppm/° C.) measured over 0 to 150° C.; specifically less than or equal to about 60 ppm/° C. measured over 0 to 150° C.; more specifically less than or equal to about 50 ppm/° C. measured over 0 to 150° C.

The above-described dielectric materials also have good thermal conductivity, on the order of 0.2 to 0.7 Watts per meter-Kelvin (W/mK), specifically 0.3 to 0.5 W/mK.

It has further been found that the materials have a high thermal stability, which results in the ability to avoid deformation or blistering during high temperature exposures such as during soldering and/or wire bonding. The combination of high heat conductivity and high thermal stability is useful in devices that generate higher heat, such as chips that run at high clock speeds, high power, larger sized chips, or optoelectronic components with heat generating laser diodes.

The compositions can further have low moisture absorption, which results in a package substrate that is less sensitive to environmental conditions both in use and during storage. In one embodiment, the moisture absorption is about 0.05 to about 0.3% at 24 hrs immersion in water at 23° C.

In addition, the compositions can attain a UL 94 rating of V-0. In one embodiment, the rating is obtained in the absence of brominated or chlorinated flame retardants.

The dielectric materials herein also have a relatively low modulus and high elongation. This is particularly helpful in the reliability of copper interconnects as it prevents excessive stress from being imparted on the walls of copper plated vias as the parts are thermally cycled. In one embodiment, the tensile modulus of the dielectric material is less than about 3000 MPa. In another embodiment, the elongation of the dielectric material is greater than about 5%.

Figure 2:
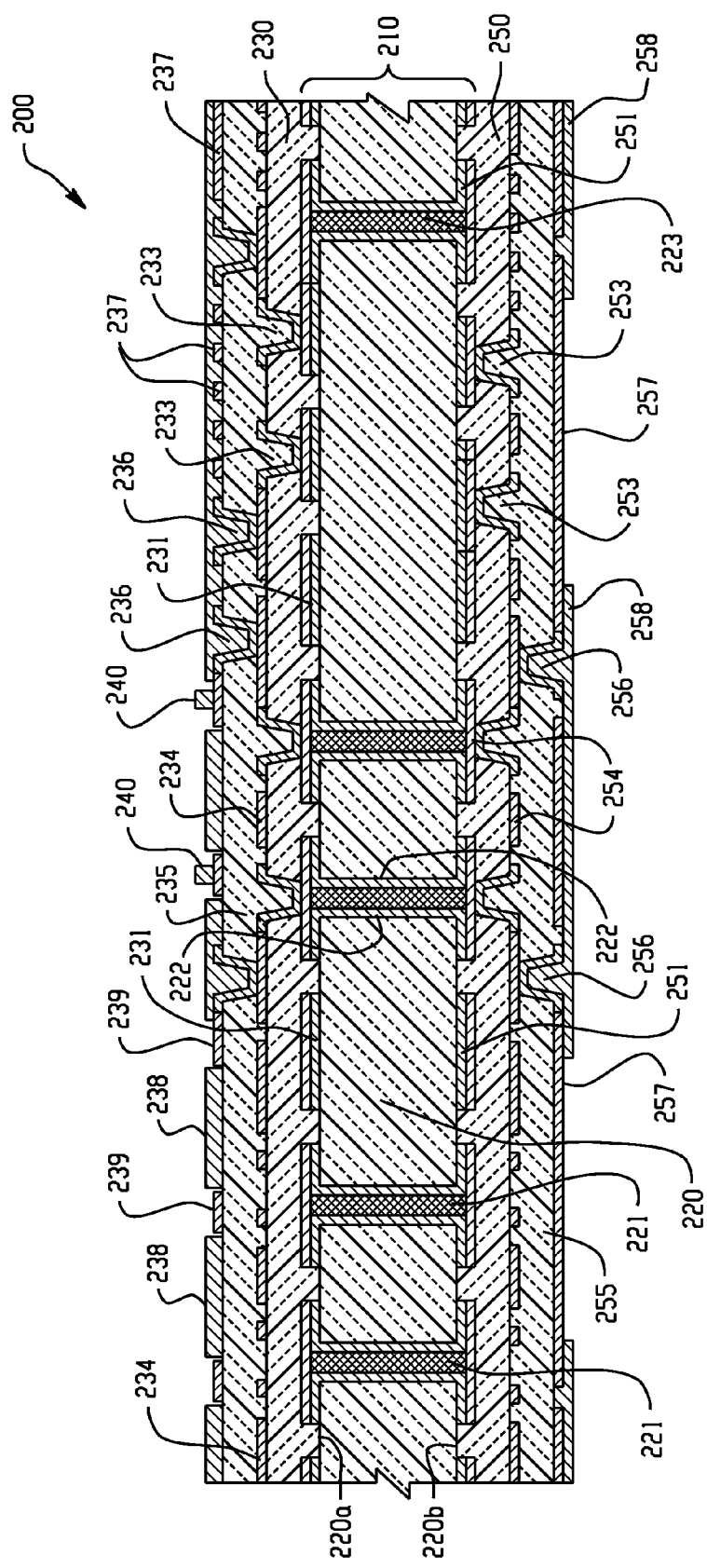
FIG. 2 shows another exemplary embodiment of a sequential buildup circuit subassembly.
Figure 3:
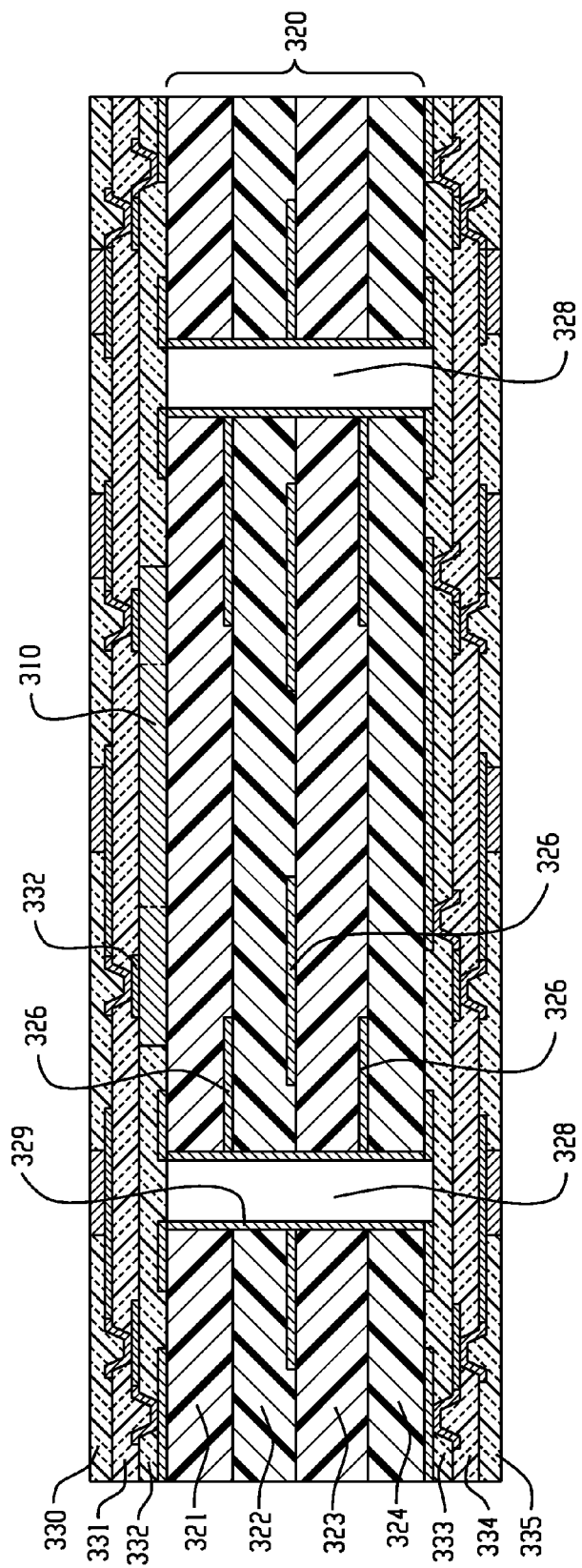
FIG. 3 shows an exemplary embodiment of a sequential buildup circuit subassembly comprising a multilayer circuit core.

As mentioned above, the dielectric materials described herein can be used in a variety of circuit subassemblies, for example in SBU circuit subassemblies, which can themselves be used in a variety of semiconductor packaging applications. The dielectric materials can be used as a buildup layer, as a dielectric substrate layer in a multilayer core, as a core adhesive layer between the circuits in the core, or a combination thereof. FIGS. 1-3 below illustrate various embodiments of an SBU assembly and show the relationship of each of these layers.

FIG. 1 illustrates a cross-sectional view of an exemplary embodiment of a SBU circuit subassembly 10. The buildup layer(s) and the core together form the SBU subassembly. The SBU subassembly 10 has a core 11 comprising a core substrate 12 having a first side 12a and a second side 12b. In this embodiment, the core substrate comprises a single layer of a substantially uniform material, e.g., a dielectric polymer. A plurality of through-holes 21 is formed to extend through the first surface 12a and the second surface 12b of the core substrate 12. Each of the through-holes 21 has a plated conductor 22 formed therein. The through-holes 21 can be further filled with a resin, e.g., and epoxy material. The core 10 further comprises a first core wiring layer 13 disposed on the core substrate first surface 12a. Portions of the first wiring layer 13 are connected to a first end of the plated conductor 22. A second core wiring layer 15 disposed on the core substrate second surface 12b, and portions of the second wiring layer 15 are connected to a second end of the plated through hole conductor 22.

A first buildup layer 30 as described herein is disposed on the core substrate first surface 12a and the first core wiring layer 13. As used herein, "disposed" means at least partial intimate contact between two layers. A first buildup wiring layer 34 is disposed on buildup layer 30. A plurality of first level via holes 33 is formed in the buildup layer 30 with the bottom of the plurality of via holes 33 exposed on the first wiring layer 13.

A second buildup layer 50 as described herein is disposed on the core substrate second surface 12b and the second core wiring layer 15. A second buildup wiring layer 54 is disposed on buildup layer 50. A plurality of first level via holes 53 is formed in the buildup layer 50 with the bottom of the plurality of via holes 53 exposed on the second core wiring layer 15.

Buildup layers can be sequentially added to the SBU subassembly of FIG. 1 until the desired number of wiring layers is achieved. FIG. 2 illustrates a cross-sectional view of an exemplary SBU subassembly of this type 200. The SBU subassembly 200 has a core 210 comprising a core substrate 220 having a first side 220a and a second side 220b. In this embodiment, the core substrate comprises a single layer of a substantially uniform material, e.g., a dielectric polymer. A plurality of through-holes 221 is formed to extend through the first surface 220a and the second surface 220b of the core substrate 220. Each of the through-holes 221 has a plated conductor 222 formed therein. The through-holes 121 can be further filled with a resin 223, e.g., an epoxy material. The core 210 further comprises a first core wiring layer 231 on the core substrate first surface 220a. Portions of the first core wiring layer 231 are connected to a first end of the plated conductor 222. A second core wiring layer 251 formed on the core substrate second surface 220b, and portions of the second core wiring layer 251 are connected to a second end of the plated through hole conductor 222.

First buildup layers 230 and 250 are disposed on the core substrate first surface 220a and first core wiring layer 231, and on the core substrate second surface 220b and second core wiring layer 251, respectively. A first buildup wiring layer 234 is disposed on the first buildup layer 230. Portions of the first buildup wiring layer 234 are connected to the first end of the plated conductor 222. A plurality of first level via holes 233 is formed in the first buildup layer 230 with the bottom of the plurality of via holes 233 exposed on the first wiring layer 231. A portion of the first buildup wiring layer 234 extends into the first level via hole 233 and contacts the first wiring layer 231 in the first direction.

Similar to the first buildup layer 230, a second buildup layer 250 is disposed on a side 220b of core 210 opposite the first buildup layer 230. The second buildup layer 250 comprises the above-described dielectric material. A second buildup wiring layer 254 is disposed on the second buildup material 250. A second plurality of first level via holes 253 is formed in the first buildup layer 250 with the bottom of the plurality of via holes 253 exposed on the first wiring layer 251. A portion of the second buildup wiring layer 254 extends into the first level via hole 253 and contacts the first wiring layer 251.

The SBU subassembly of FIG. 2 further includes third buildup layer 235 and fourth buildup layer 255 disposed on the first and second buildup layers 230 and 250, respectively. Thus, third buildup layer 235 covers the first buildup wiring layer 234. A plurality of second level via holes 236 is formed in the third dielectric layer 235 with the bottom of the plurality of vial holes 236 exposed on the second wiring layer 234. Likewise, a third buildup wiring layer 237 is formed on the third dielectric layer 235 and a portion of the third wiring layer 237 extends into the second level via hole 236 and contacts the second wiring layer 234 in the first direction. Fourth buildup layer 255 covers the second buildup wiring layer 254.

A plurality of second level via holes 256 is formed in the fourth dielectric layer 255 with the bottom of the plurality of vial holes 256 exposed on the second buildup wiring layer 254. Likewise, a fourth buildup wiring layer 257 is formed on the fourth dielectric layer 255 and a portion of the fourth wiring layer 257 extends into the second level via hole 256 and contacts the second wiring layer 254 in the first direction.

Further as shown in FIG. 2, a solder resist layer 238 is coated on the third dielectric layer 235 and covers the third wiring layer 237. A plurality of openings 239 is formed in the solder resist layer 238 with the bottom of the plurality of openings 239 exposed to the third wiring layer 237. A plurality of contacting pads 240 can be deposited in the openings 239 and on the third wiring layer 237 for attaching a semiconductor chip to the SBU subassembly (not shown). Similar solder resist layer 258 and optional contacting pads (not shown) can be disposed on fourth buildup layer 255.

FIG. 3 illustrates another exemplary embodiment of a SBU subassembly 300. Unlike the SBU subassemblies 100 and 200 of FIGS. 1 and 2, the SBU subassembly 300 comprises a multilayer PCB core 320. As it is apparent for a person skilled in the art, the design of the core 320 is similar to the design of a conventional PCB and may be formed by conventional laminated PCB processing techniques. In this embodiment, the multilayer PCB core 320 includes four circuit laminate layers comprising dielectric substrate layers 321, 322, 323, and 324. Wiring layers 326 are arranged between the dielectric substrate layers. Core through-holes 328 are arranged to penetrate the core circuit laminate layers and are used to electrically connect specific metal layers 326 of the multilayer core substrate 320. To this end, the core through-holes 328 are internally coated by a metal plating jacket 329. Thus, the core through-holes 328 are typically formed by mechanical drilling and extend through the entire core 320.

Buildup layers 330, 331, and 332 are sequentially disposed on one side of core substrate 320, and buildup layers 333, 334, and 335 are sequentially disposed at the opposite side of the core substrate 320. The buildup layers are disposed on the core 320 in the same manner as described above for the SBU subassembly 200, with one exception: the SBU subassembly 300 further includes an embedded component 310 within the buildup layer 332 of the laminate. The embedded component 310 can comprise any circuitry component suitable for the desired application of the SBU subassembly 300. Exemplary embedded components can include, without limitation, capacitors, resistors, chips, and the like. By embedding the component, a significant reduction in size can be achieved for the semiconductor package compared to standard component surface mounting techniques. The embedded component 310 can be disposed in electrical communication with one or more wiring layers of the buildup layer 332. As shown, buildup layers 331 and 330 are laminated over the component 310.

In the SBU subassembly embodiments described above, the buildup layers generally provide for redistribution of the IC signals to the core substrate (e.g., a PCB). Most of the wiring capability of the SBU subassembly, such as signal routing, occurs in the buildup layers. In some embodiments, as shown in FIG. 3, the buildup layers are also used to embed IC devices within the package. The core substrate serves as the carrier for fabricating the buildup layers and provides for an adequate rigidity of the SBU subassembly. In addition, power distribution is accomplished by the core.

The core can have any shape and thickness suitable for the desired semiconductor packaging applications, as would be known to one of skill in the art. The core can comprise a substantially uniform material or multiple layers of material. Exemplary core materials include, without limitation, metals, polymeric organic materials, and ceramics. In one embodiment, the core is a unitary metallic layer, such as a copper, aluminum, or metal alloy plate. In another embodiment, the core is a single clad circuit laminate or a double clad circuit laminate as illustrated in FIGS. 1 and 2, or a multilayer circuit laminate that includes two or more dielectric circuit substrate layers, one or more bond plies (adhesive layers), and multiple core wiring layers of a conductive metal. One example of a multilayer circuit laminate as a core is illustrated in FIG. 3.

One or more of the dielectric substrate layers in the core and/or one or more of the adhesive layers in the core can comprise the dielectric material described herein. Alternatively, other core dielectric substrate and/or adhesive materials can be used, for example glass fiber-reinforced epoxy or bismaleimide triazine (BT) resin, and other low polarity, low dielectric constant and low loss resins such as those based on resins such as 1,2-polybutadiene, polyisoprene, poly(etherimide) (PEI), polytetrafluoroethylene (PTFE), liquid crystal polymers, polybutadiene-polyisoprene copolymers, poly (phenylene ether) resins, and those based on allylated poly (phenylene ether) resins. Combinations of low polarity resins with higher polarity resins can also be used, non-limiting examples including epoxy and poly(phenylene ether), epoxy and poly(ether imide), and cyanate ester and poly(phenylene ether). Cores for use in the SBU subassemblies can be manufactured by known methods, and are commercially available. Compositions containing polybutadiene, polyisoprene, and/ or butadiene- and isoprene-containing copolymers are especially useful, for example the RO4000 series of materials from Rogers Corporation. Such material can optionally further include woven, thermally stable webs of a suitable fiber, specifically glass (E, S, and D glass) or high temperature polyester fibers (e.g., KODEL from Eastman Kodak).

In the manufacture of the SBU subassemblies, the buildup layer is formed, and then adhered or laminated to a face of the core, specifically to a wiring layer on a face of the core. In a specific embodiment, two buildup layers are adhered or laminated to the core simultaneously, one on each face of the core. The buildup layers can be manufactured by processing techniques, such as by casting, solvent casting, and the like.

In practice, the components of the composition used to form the dielectric material for the buildup layers or the core layers are dissolved and/or suspended to provide a coating mixture or solution. The solvent is selected so as to dissolve the resin composition, disperse the fillers and to have a convenient evaporation rate for forming and drying the layer. A non-exclusive list of possible solvents is xylene, toluene, methyl ethyl ketone, methyl isobutyl ketone, hexane, and higher liquid linear alkanes, such as heptane, octane, nonane, and the like, cyclohexane, isophorone, and various terpene-based solvents. Specific exemplary solvents include xylene, toluene, methyl ethyl ketone, methyl isobutyl ketone, and hexane, and still more specifically xylene and toluene. The concentration of the components of the composition in solution is not critical and will depend on the solubility of the components, the filler level used, the method of application, and other factors. In general, the solution comprises 10 to about 50 wt % solids (all components other than the solvent), more specifically about 15 to about 40 wt % solids, based on the total weight of the solution. The coating mixture can be formed onto a carrier from which it is later released, or alternatively onto a conductive metal layer that will later be formed into a layer of the circuit structure.

After the layer is formed, e.g., by casting, solvent is allowed to evaporate under ambient conditions, or by forced or heated air, to form the dielectric layer. The dielectric layer can be uncured or partially cured (B-staged) in the drying process, or the dielectric layer can be partially or fully cured, if desired, after drying. The dielectric layers can be stored prior to lamination and cure, partially cured and then stored, or laminated and fully cured after buildup.

The thickness of the dielectric layer will depend on its intended use. In one embodiment, when used as a buildup layer, the dielectric layer thickness is about 5 to about 100 micrometers; specifically about 5 to about 50 micrometers; and more specifically about 5 to about 40 micrometers. In another embodiment, when used as a core dielectric substrate layer, the dielectric layer thickness is about 25 to about 400 micrometers; specifically about 50 micrometers to about 200 micrometers; and more specifically about 75 micrometers to about 150 micrometers. When used as an adhesive layer between cores, the dielectric layer thickness is about 5 to about 100 micrometers; specifically about 10 micrometers to about 75 micrometers; and more specifically about 15 micrometers to about 50 micrometers.

When used as a buildup layer, the dielectric layer is disposed on a face of the core and adhered thereto using lamination. When a film carrier is used for the dielectric layer, it is removed after lamination. In particular, the SBU subassembly is built up by disposing one or more dielectric layers on the core wiring layers and/or the core substrate. Lamination and curing can be by a one-step process, for example using a vacuum press, or by a multiple-step process. In an exemplary multiple-step process, a conventional peroxide cure step at temperatures of about 150° C. to about 200° C. is conducted, and the partially cured buildup stack can then be subjected to a high-energy electron beam irradiation cure (E-beam cure) or a high temperature cure step under an inert atmosphere. Use of a two-stage cure can impart an unusually high degree of cross-linking to the resulting SBU subassembly. This high temperature cure can be carried out in an oven but can also be performed in a press, namely as a continuation of the initial lamination and cure step. Particular lamination temperatures and pressures will depend upon the particular dielectric material composition and the core substrate composition, and are readily ascertainable by one of ordinary skill in the art without undue experimentation.

The wiring layers comprise an electrically conductive surface with a plurality of circuitry patterns configured to provide the various wiring functions. The wiring layers can be formed of various conductive materials including, without limitation, copper, gold, nickel, silver, palladium, tin, combinations thereof, alloys thereof, and the like. The wiring layers can then be formed on the outer face of the buildup layer by numerous deposition techniques. In a subtractive metallization process, a blanket layer of metal is formed on the buildup layer; and a photoresist and metal etch process is used to remove a portion of the blanket layer to define the conductive traces of the wiring layer. The blanket layer of metal can be added formed through either electroless plating or electrolytic plating. Electroless plating uses metal deposition from solution by chemical activation of the surface. Electrolytic plating uses current-induced metal deposition through an electrolyte. In a fully additive metallization process, conductive traces are directly formed on the dielectric layer or the core substrate, for example by printing, ink jetting or laser direct structuring the conductive wiring layer. In a semi-additive metallization process, a blanket seed layer of conductive metal is formed on the dielectric layer or the core substrate; after the conductive traces of a desired thickness are formed using a photoresist and plating process, the seed layer outside the traces is removed. In one embodiment, the wiring layer has a thickness of about 1 micrometers to about 10 micrometers; specifically about 1 micrometers to about 5 micrometers; and more specifically about 3 micrometers.

The plurality of via holes can be formed in the buildup layers by known methods. In one embodiment, the plurality of via holes, which are blind and buried, are formed by laser drilling. In another embodiment, other techniques are used, such as photo-structuring. In some embodiments, the vias are a tapered configuration having different top and bottom diameters. Metallization of the vias can be formed by sputtering or plating a metal over the entire surface of the underlying dielectric layer.

Multiple buildup layers can be formed by disposing an additional dielectric layer and repeating the via formation and wiring layer metallization process. In some embodiments, passive components such as capacitors, resistors, and inductors can be embedded during the layer buildup process. Moreover, while the embodiments of FIGS. 1-3 illustrate examples of laminating buildup layers on both sides of the core substrate, it is understood that the SBU subassembly is not necessarily symmetric in layers of materials on both sides of the core. For example, the structure may have more levels of dielectric and wiring layers on one side than the other side. Further, it is not necessary to apply the dielectric layers on both sides at the same time. For example, one can laminate a single layer of a buildup material and form a metallic wiring layer on one side before laminating or coating the other side.

Figure 4:
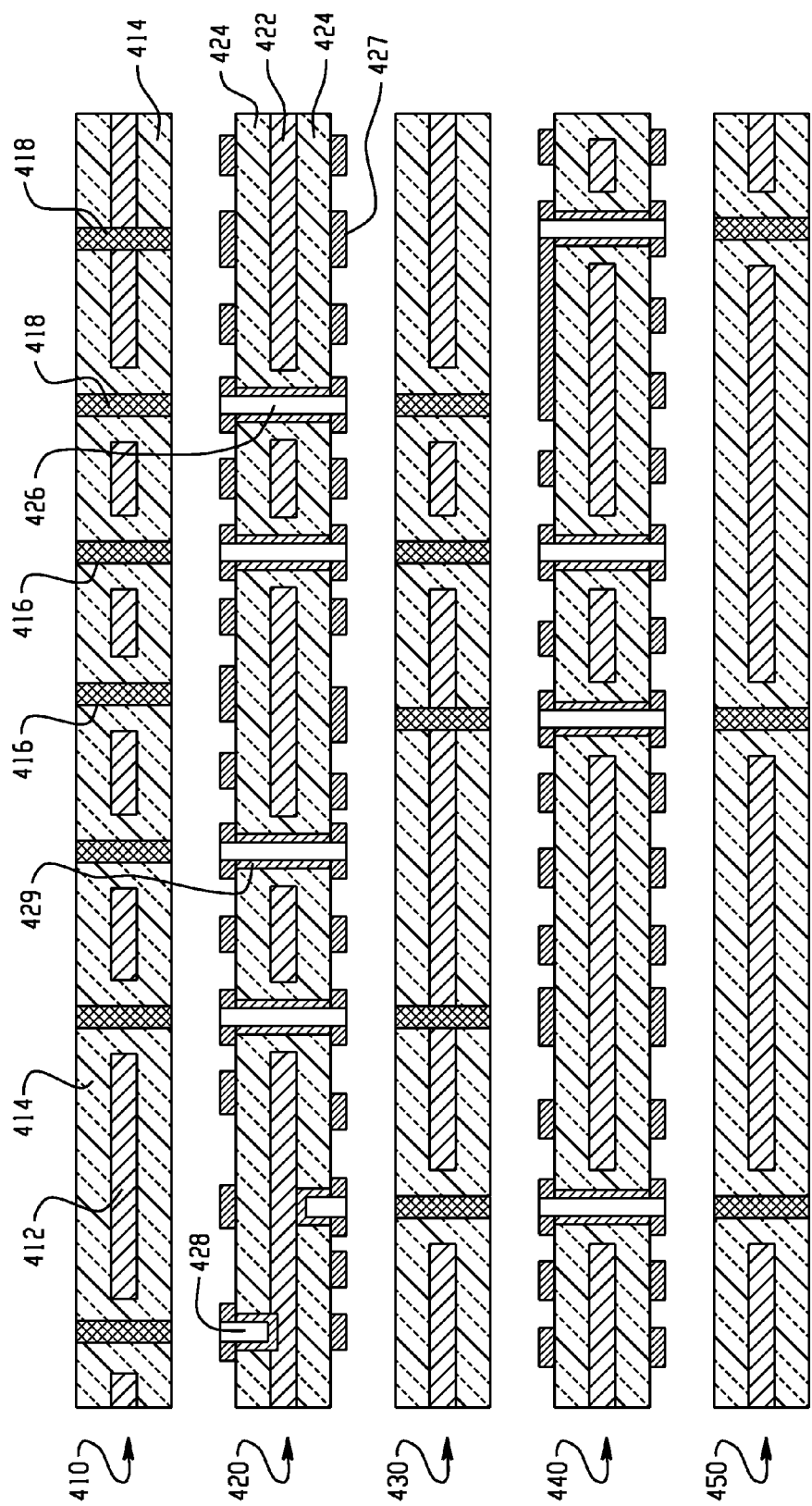
FIG. 4 shows an exemplary embodiment of a subcomposite circuit subassemblies used to form a vertically integrated interconnect circuit subassembly.
Figure 5:
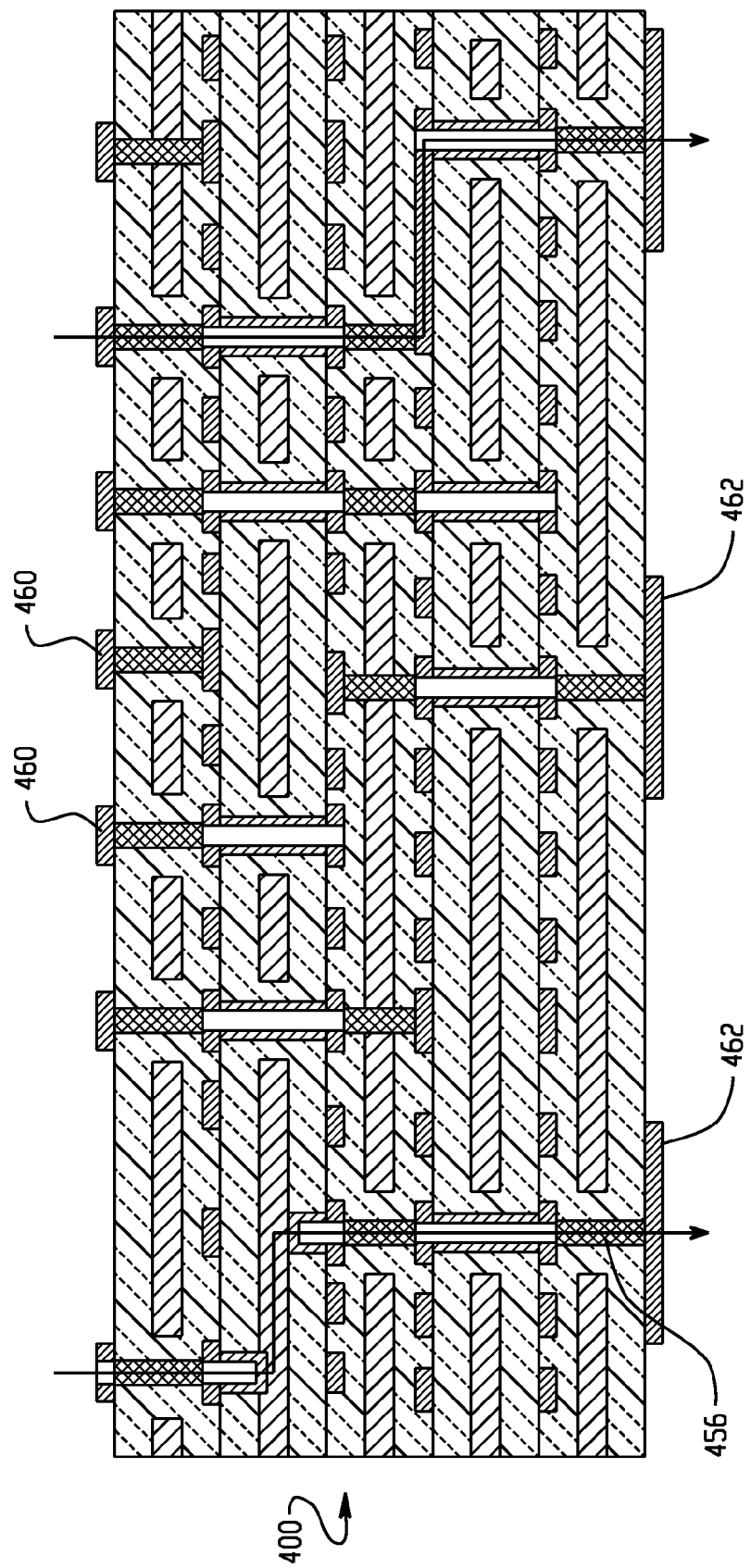
FIG. 5 shows an exemplary embodiment of a vertically integrated interconnect circuit subassembly formed from the subcomposites of FIG. 4.

In some semiconductor packaging applications requiring greater wiring density it is preferable to use a vertically integrated interconnect structure, sometimes referred to as a vertically integrated interconnect subassembly or a vertically integrated interconnect laminate chip carrier. Vertically integrated (sometimes referred to as Z-axis) interconnection is a means of routing circuit traces vertically within and through the semiconductor package. High-end semiconductor devices require high wiring density due to the increasing numbers of signal/power die pads with decreasing die pitch. The vertically integrated interconnect subassemblies can be formed by a number of methods and provide an alternative to the SBU process. FIGS. 4 and 5 illustrate an exemplary embodiment of a vertically integrated interconnect subassembly.

FIG. 4 illustrates a cross-sectional view of an exemplary embodiment of five subcomposites used to form a vertically integrated interconnect subassembly 400. The subcomposites are laminated together to form the vertically integrated interconnect subassembly 400. Electrical connections between each subcomposite are made using an electrically conductive paste or by conductive plating in the holes. Subcomposite 410, 430, and 450 are also known as joining cores. Disposed between the three joining cores are two subcomposites 420 and 440, also known as signal cores. The subcomposite 410 (joining core) comprises a power layer 412 sandwiched between two dielectric layers 414. The subcomposite 410 further comprises through-holes 416 that pass completely through the each layer of subcomposite. The through-holes 416 are filled with an electrically conductive adhesive 418 configured to form electrically conductive joints between each subcomposite in the vertically integrated interconnect subassembly. In this embodiment, each of the joining cores, subcomposites 410, 430, 450, comprise the same layer structure. The only difference between each joining core, as can be seen in the figure, is the pattern of the power layer and the number and placement of through-holes in the subcomposites 410, 430, 450. The subcomposite 420 (signal core) comprises a power layer 422 sandwiched between two dielectric layers 424. Unlike subcomposites 410, 430, 450 (joining cores), the subcomposite 420 (signal core) further comprise a signal layer 427 on a side of each dielectric layer 424 opposite the power layer 422. The subcomposite 420 further comprises vias 428 formed in one or more layers of the subcomposite, and through-holes 426 that pass completely through each layer of the subcomposite. Each of the through-holes 426 and vias 428 has a plated conductor 429 formed therein.

FIG. 5 shows the vertically integrated interconnect subassembly 400 with the subcomposites in physical communication with each other. As such, the vertically integrated interconnect subassembly 400 is a structure having four signal layers composed of five subcomposites. Although this particular construction comprises alternating joining cores and signal cores, alternative arrangements can have multiple joining cores adjacent to each other in the subassembly stack. In some embodiments, multiple signal cores can be adjacent to each other in the subassembly stack. FIG. 5 further illustrates a plurality of contacting pads 460 (e.g., C4 flip chip solder joints) deposited on the through-holes 416 of the subcomposite 410. A plurality ball grid array (BGA) solder balls 462 are deposited on the through-holes 456 of the subcomposite 450 at the bottom of the subassembly 400. Based on the vertical interconnections, an electrical transmission line can extend from a flip-chip (not shown) down through the subassembly 400 to a board (not shown).

The subcomposites can have any shape and thickness suitable for the desired semiconductor packaging applications, as would be known to one of skill in the art. Exemplary wiring and signal materials include electrically conductive metals such as, without limitation, copper, aluminum, silver, gold, stainless steel, zinc, tin, lead, transition metals, combinations thereof, alloys thereof, and the like, with copper being exemplary. One or more of the dielectric layers in the subcomposites comprise the dielectric material described herein.

In the manufacture of the vertically integrated interconnect subassembly, the subcomposites can be formed in parallel, aligned with respect to one another, and then adhered or laminated together to from a composite laminate. The net result is a vertically integrated interconnect subassembly having vertical interconnections with through-holes that can terminate arbitrarily at any layer within the cross-section of the package.

The subcomposites can be manufactured by printed circuit board and thin-film processing techniques, for example casting, solvent casting, patterning, etching, laser drilling, and the like.

In one embodiment, the dielectric layers in the subcomposites have a thickness of about 10 to about 600 micrometers; specifically about 50 micrometers to about 200 micrometers; and more specifically about 75 micrometers to about 150 micrometers.

For the joining core subcomposites, the power layer, which can be a copper foil, is etched. A dielectric layer is then disposed on either face of the power layer. The dielectric-power-dielectric layer sandwich is further layed up with a metal layer on each face of sandwich. The five layer stack is laminated together. Lamination and curing can be by a one-step process, for example using a vacuum press, or by a multiple-step process. In an exemplary multiple-step process, a conventional peroxide cure step at temperatures of about 150° C. to about 200° C. is conducted, and the partially cured buildup stack can then be subjected to a high temperature cure step under an inert atmosphere. Use of a two-stage cure can impart an unusually high degree of cross-linking to the resulting vertically integrated interconnect subassembly. This high temperature cure can be carried out in an oven but can also be performed in a press, namely as a continuation of the initial lamination and cure step. Particular lamination temperatures and pressures will depend upon the particular dielectric material composition, and are readily ascertainable by one of ordinary skill in the art without undue experimentation.

The plurality of through-holes can then be formed in the layers by known methods. In one embodiment, the plurality of through-holes are formed by laser drilling The plurality of through-holes are then filled with an electrically conductive paste. Exemplary electrically conductive pastes provide a conductive joint between each subcomposite in the vertically integrated interconnect subassembly. The electrically conductive paste is a composite material comprising a non-conductive polymer binder and conductive filler particles. Exemplary electrically conductive paste compositions can include, without limitation, nano- and micro-filled copper, silver, and low melting point (LMP)-based particles dispersed in an adhesive resin, such as epoxy. After the through-holes have been filled with the paste, the outer metal layers can be etched away leaving electrically conductive paste columns protruding from the dielectric layer surfaces.

For the signal core subcomposites, the power layer, which can be a copper foil, is etched. A dielectric layer is then disposed on either face of the power layer. The dielectric-power-dielectric layer sandwich is laminated together and a plurality of through-holes can then be formed in the layers by known methods. At this stage, a plurality of vias can be optionally formed as well. In one embodiment, the plurality of through-holes (and vias) are formed by laser drilling. The wiring layers of the signal core subcomposites comprise an electrically conductive surface with a plurality of circuitry patterns configured to provide the various wiring functions. The wiring layers can be formed of various conductive materials including, without limitation, copper, gold, nickel, silver, palladium, tin, combinations thereof, alloys thereof, and the like. The wiring layers can then be formed on the outer face of the dielectric layers by numerous deposition techniques. In one embodiment, a semi-additive metallization process is employed, wherein a blanket seed layer of conductive metal is formed on the dielectric layer; after the conductive traces of a desired thickness are formed using a photoresist and plating process, the seed layer outside the traces is removed.

These subcomposites can be formed as described above individually or in parallel. Regardless, when the subcomposites are formed, they can be aligned on top of one another and then adhered or laminated together to form the vertically integrated interconnect subassembly. The electrically conductive paste on the outer surface of each dielectric layer in the joining core subcomposites form a conductive joint between the joining core subcomposites and the signal core subcomposites.

Figure 6:
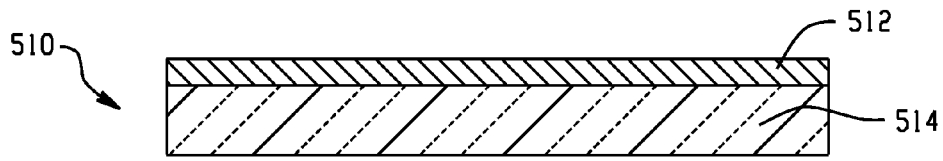
FIG. 6 shows an exemplary embodiment of a single clad laminate.

In still other embodiments, the dielectric material can also be used as bond plies, resin coated conductive layers, dielectric substrate layers in circuit laminates, and the like, in circuit subassemblies, and multilayer circuits. Turning now to FIG. 6, an exemplary embodiment of a circuit subassembly, in particular a single clad laminate 510 is illustrated. The single clad laminate 510 comprises a conductive metal layer 512 disposed on and in contact with a dielectric layer 514. The dielectric substrate layer 514 comprises the dielectric material described herein. It is to be understood that in all of the embodiments described herein, the various layers can fully or partially cover each other, and additional conductive layers, patterned circuit layers, and dielectric layers can also be present. Optional adhesive layers (not shown) can also be present. Many different multi-layer circuit configurations can be formed using the above substrates.

Figure 7:
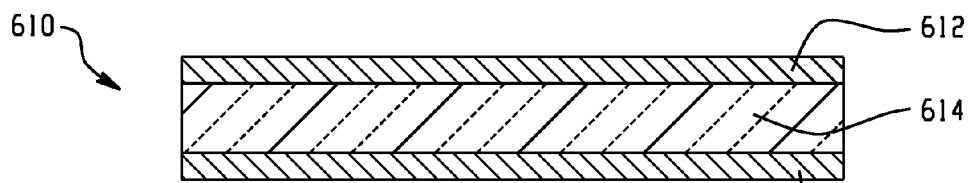
FIG. 7 shows an exemplary embodiment of a double clad laminate.
Figure 8:
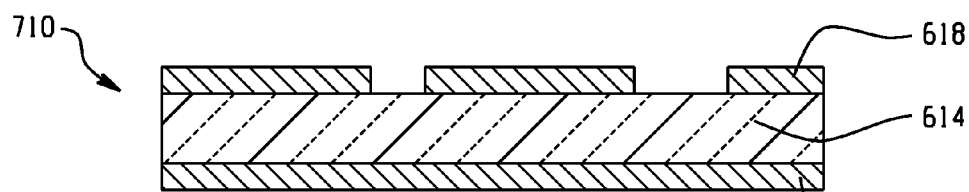
FIG. 8 shows an exemplary embodiment of a double clad laminate circuit subassembly with patterned conductive layer.

Another embodiment of a circuit subassembly is shown at 610 in FIG. 7, in particular a double clad circuit laminate. Double clad circuit laminate 610 comprises conductive layers 612, 616 disposed on opposite sides of a dielectric substrate layer 614. The dielectric substrate layer 614 comprises the dielectric material. One or both of the conductive layers 612, 616 can be in the form of a circuit. For example, as shown in FIG. 8, a circuit subassembly 710 comprises a circuit layer 718 and a conductive layer 716 disposed on opposite sides of a dielectric substrate layer 714. Dielectric substrate layer 714 comprises the dielectric material described herein.

Figure 9:
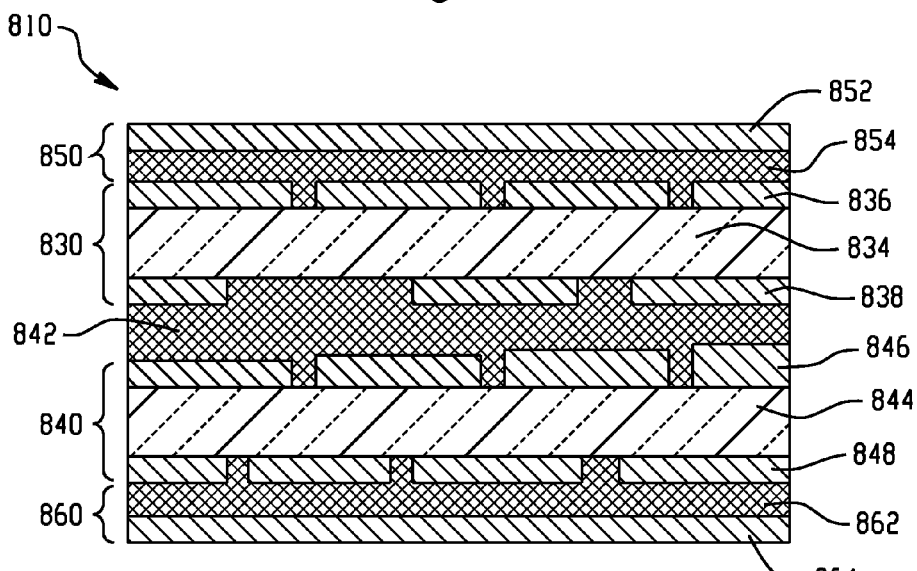
FIG. 9 shows an exemplary embodiment of an exemplary multilayer circuit comprising two double clad circuit laminates.

The dielectric materials can further be used as a bond ply to adhere two circuits or circuit subassemblies. For example, FIG. 9 shows an exemplary multilayer circuit 810 comprising one or more circuit subassemblies as described herein. Multilayer circuit 810 has a first double clad circuit 830, a second double clad circuit 840, and a bond ply 842 disposed therebetween. Double clad circuit 830 comprises a dielectric substrate 834 disposed between two conductive circuit layers 836, 838. Double clad circuit 840 comprises a dielectric substrate 844 disposed between two conductive circuit layers 846, 848. In one embodiment, at least one, and preferably both, of dielectric substrates 834, 844 comprises the dielectric material described herein. In another embodiment, the bond ply 842 can comprise the dielectric material described herein. The multilayer circuit assembly further includes two layers 850, 860. Each such cap layer 850, 860, includes a conductive layer 852, 862 disposed on a bond ply layer 854, 864. In still another embodiment, the bond ply layers 854, 864 of the cap layers 850, 860 can comprise the dielectric material as described herein. In other words, the dielectric material described herein can be used in a selected one or all of the dielectric substrates, the bond plies, and the cap layers of the multilayer circuit 810.

Useful conductive layers for the formation of the circuit laminates, including multi-layer circuit laminates for use in vertically integrated interconnect structures or in cores for SBU subassemblies, can include, without limitation, stainless steel, copper, gold, silver, aluminum, zinc, tin, lead, transition metals, combinations thereof, alloys thereof, and the like, with copper being exemplary. There are no particular limitations regarding the thickness of the conductive layer, nor are there any limitations as to the shape, size or texture of the surface of the conductive layer. Preferably however, the conductive layer comprises a thickness of about 3 micrometers to about 200 micrometers, specifically about 9 micrometers to about 180 micrometers. When two or more conductive layers are present, the thickness of the two layers can be the same or different.

In an exemplary embodiment, the conductive layer is a copper layer. Suitable conductive layers include a thin layer of a conductive metal such as a copper foil presently used in the formation of circuits, for example, electrodeposited copper foils.

The copper foil can be made either by the electrodeposition (ED) on a rotating stainless steel drum from a copper sulfate bath, or by the rolling of solid copper bars. Where ED copper foil is used, the initial roughness of the base foil is created in the foil plating process on the "bath side" (or matte side) of the foil. Additional roughness is created in a secondary plating step. Where rolled foil used, roughness is imparted to the initially smooth and shiny foil by a secondary plating step.

This mechanical roughness can result in several drawbacks. As described in detail by Brist et al. (Gary Brist, Stephen Hall, Sidney Clouser, and Tao Liang, "Non-classical conductor losses due to copper foil roughness and treatment," p. 26, *Circuitree*, can 2005) and Ogawa et al. (N. Ogawa, H. Onozeki, N. Moriike, T. Tanabe, T. Kumakura, "Profile-free foil for high-density packaging substrates and high-frequency applications," p. 457, Proceedings of the 2005 Electronic Components and Technology Conference, IEEE), the roughness on a conductor surface can result in a substantial increase in conductor loss at high frequencies, with a rough conductor causing up to twice the conductor loss of a smooth one. Ogawa also describes the limitations to accurate circuit fabrication, most notably the accurate etching of fine lines and spaces that are caused by conductor roughness.

The roughness of a copper foil is generally characterized by contact profilometry or optical interferometry. Most foil manufacturers measure roughness with a contact profilometer, due to their long history with such a measurement system. Most of the values cited herein were measured using a Veeco Instruments WYCO Optical Profiler, using the method of white light interferometry. Since the roughness can exist on several different scales and will consist of many peaks and valleys with varying distances from a fixed reference plane, there are many different ways to numerically characterize the surface roughness. Two frequently reported quantities are the RMS roughness value, Rq, and the peak-to-valley roughness, Rz, with both reported in dimensions of length.

Conventional ED copper foil made for the circuit industry has had treated side Rz values of 7 to 20 micrometers (um) (corresponding to Rq values of about 1.2 to 4 um) when measured by the WYCO Optical Profiler. Contact profilometers tend to yield lower values, due to the stylus deforming the copper treatment as the measurement is made. The treated side of rolled copper foil exhibits Rz values of 3.5-5.5 um (corresponding to Rq values of 0.45-0.9 um). "Reverse treated" ED foils, such as Oak-Mitsui MLS-TOC-500 can also exhibit Rq values similar to those of rolled foils. The lower profile ED foils currently exhibit Rz values of 2 to 3 um.

By WYCO measurement, the shiny side of rolled foil exhibits an Rz value of about 0.7 um and a corresponding Rq of about 0.1 um.

More recently, other types of low profile electrodeposited foils have been commercially available. These include Oak Mitsui products SQ-VLP, with an Rq value measured by the WYCO of 0.7 um and MQ-VLP with a WYCO Rq value of 0.47 um.

Both rolled and ED foils specially treated for the circuit industry are available from a number of commercial manufacturers. For example, low profile copper foils are commercially available from Oak Mitsui under the trade name "TOC-500" MLS and "TOC-500-LZ", from Nippon Denkai under the trade name "USLP", and from Furukawa under the trade name "F1WS". High profile copper foils are commercially available from Circuit Foil under the trade name "TWS." The copper conductive layer can be treated to increase surface area, treated with a stabilizer to prevent oxidation of the conductive layer (i.e., stainproofing), or treated to form a thermal barrier. Both low and high roughness copper conductive layers can be treated with zinc or zinc alloy thermal barriers, and can further optionally comprise a stain-proofing layer.

The circuit laminates illustrated in FIGS. 6 and 7 can be formed by means known in the art. In one embodiment, the lamination process entails placing layers of the dielectric material between one or two sheets of coated or uncoated conductive layers (an adhesive layer can be disposed between at least one conductive layer and at least one dielectric substrate layer) to form a circuit substrate. The layered material can then be placed in a press, e.g. a vacuum press, under a pressure and temperature and for a duration of time suitable to bond the layers and form a laminate. Lamination and curing can be by a one-step process, for example using a vacuum press, or by a multiple-step process.

In an exemplary multiple-step process suitable for thermosetting materials such as the dielectric materials described herein, a conventional peroxide cure step at temperatures of about 150° C. to about 200° C. is conducted, and the partially cured stack can then be subjected to high temperature cure step under an inert atmosphere. Use of a two-stage cure can impart an unusually high degree of cross-linking to the resulting laminate. The temperature used in the second stage is typically about 250° C. to about 300° C., or the decomposition temperature of the resin. This high temperature cure can be carried out in an oven but can also be performed in a press, namely as a continuation of the initial lamination and cure step. Particular lamination temperatures and pressures will depend upon the particular adhesive composition and the substrate composition, and are readily ascertainable by one of ordinary skill in the art without undue experimentation.

EXAMPLES

The materials in Table 1 were used in the following examples.

TABLE 1

| Material Name ™ | Chemical Name | Supplier |
| --- | --- | --- |
| Blendex HPP820 | Unmodified polyphenylene ether (PPE) | Chemtura |
| Noryl 640-111 | Unmodified polyphenylene ether (PPE) | Sabic Innovative Plastics |
| SA5587 | Methacrylic Anhydride Capped PPE | Sabic Innovative Plastics |

TABLE 1-continued

| Material Name ™ | Chemical Name | Supplier |
| --- | --- | --- |
| OPE-2STY | Styrenated polyphenylene ether | Mitsubishi Gas Company |
| Kraton D-1118 | SB diblock copolymer (20%) and SBS triblock copolymer (80%) | Kraton Polymers |
| Ricon 184 MA-6 | Maleinated butadiene-styrene copolymer | Sartomer |
| TAIC | Trially isocyanurate | Aldrich |
| Perkadox 30/ Varox | Curing agent | Akzo Nobel |
| SC 2050 TNG | Silica dispersion in toluene | Admafine (Japan) |
| BA-188 | Silica powder | CE Minerals |
| Kisuma 8SN | Magnesium hydroxide | Kyowa Chemicals |
| CAB-O-SIL TS-720 | Fumed silica powder | Cabot Corporation |
| Budit 3141CA | Melamine polyphosphate | Budenheim |
| TiPure 101 | Titanium dioxide powder | DuPont |
| Angular BNT | Barium nanotitanate | Dimat Inc |
| Code 218 | Strontium titanate | Ferro Corp. |
| Chimassorb 944LD | Antioxidant | CIBA |

Minimum melt viscosity was measured using the ARES rheometer manufactured by TA Instruments Inc. The sample was heated to 250° C. at rate 5° C./min, and minimum melt viscosity was determined from the melt curve.

Copper peel strength was tested in accordance with the "Peel strength of metallic clad laminates" test method (IPC-TM-650 2.4.8)

The laminate was tested for solder float by floating them on a pot of molten solder at a temperature 288° C. for 10 seconds. This procedure is repeated five times on each sample. A failure in the solder float test is noted if there is blistering or delamination of the copper foil from the laminate surface.

Water absorption was measured in accordance with the test method, IPC-TM-650 2.6.2.1 (conditioned in an environment maintained at 50% relative humidity and 22° C. for 1 hour (prior to soaking in water).

Dielectric layers for circuit subassemblies were prepared using the dielectric composition as set forth in Table 2.

TABLE 2

| | Ex, 1 | Ex. A | Ex. B |
| --- | --- | --- | --- |
| Ingredients | | | |
| Noryl 640-111 unmodified PPE | 4.96 g | 3.77 g | 2.42 g |
| SA 5587 capped PPE | | 1.26 g | |
| OPE-2STY styrenated PPE | | | 2.42 g |
| Kraton D1118 block copolymer | 3.86 g | 3.92 g | 3.92 g |
| Ricon 184 MA-6 maleinated butadiene-styrene copolymer | 3.86 g | 3.92 g | 3.78 g |
| SC 2050 TNG silica dispersion | 18.91 g | 19.17 g | 18.49 g |
| Chimassorb 944 LD antioxidant | 0.19 g | 0.19 g | 0.19 g |
| Triallyl isocyanurate | | 3.8 g | 1.9 g |
| Perkadox 30 curing agent | | 1.18 g | 0.57 g |
| Varox curing agent | 0.25 g | | |
| Properties | | | |
| Minimum Melt Flow, CP | $5 \times 10^6$ | $1 \times 10^5$ | $1 \times 10^5$ |
| Bond (½ oz MLS), pli | 6.45 | 5.01 | 4.49 |
| Solder Float, 288° C. | Pass | Pass | Pass |
| Dielectric Strength, V/mil | 3836 | 3708 | 2399 |
| Specific Gravity | 1.48 | 1.48 | 1.5 |
| Z CTE (0-100° C.), ppm | 60 | 61 | 41 |
| Dk @ 10 GHz | 2.91 | 2.93 | 2.95 |
| Df at 10 GHz | 0.003 | 0.003 | 0.003 |
| Water Absorption, 24 hr, % | 0.1 | 0.12 | 0.12 |

The examples in Table 2 illustrate that selected dielectric layer compositions of the invention achieve low loss and low water absorption, both much lower than the published loss and water absorption of the Ajinomoto GX13 often used in buildup applications (i.e., a loss of 0.019 at 6 GHz and water absorption of 1.1%). In addition, the Ex. A and B materials have desirable minimum melt viscosities and CTEs.

Dielectric layers for circuit subassemblies were prepared using the dielectric composition as set forth in Table 3, providing further examples of low loss/low CTE compositions.

TABLE 3

|  | Ex. C | Ex. D | Ex. E |
|---|---|---|---|
| BA-1-88 silica powder, vol % | 0 | 40 | 0 |
| SC2050-TNG silica disp., vol % | 40 | 0 | 50 |
| TS-720 fumed silica powder, vol % | 0.7 | 0 | 0.7 |
| Properties |  |  |  |
| Bond (½ oz MLS), pli | 5.5 |  | 6.3 |
| Bond (½ oz SQ-VLP), pli | 7.4 | 5.6 | 6.1 |
| Solder Float (288° C., 10 sec/5x) | Pass | Pass | Pass |
| Z CTE (0-100° C./0-150° C.) | 64.5/70.5 | 71.9/84.9 | 53.6/56.2 |
| Water Absorption, wt %, 24 hr. | 0.15 | 0.33 | 0.19 |
| Dk @ 2 GHz/10 GHz | 2.92/2.91 | 2.94/2.94 | 3.08/3.08 |
| Df @ 2 GHz/10 GHz | 0.0030/0.0026 | 0.0035/0.0031 | 0.0029/0.0029 |
| Ash, wt % (TGA Method) (700° C.) | 58.8 | 57.3 | 68.4 |

The dielectric layers in Table 3 are based on a 2/1/1 ratio by weight of Noryl 640-11 poly(phenylene ether), Kraton D1118 block copolymer and Ricon 184 MA-6 maleinated butadiene-styrene copolymer and include Chimassorb 944 antioxidant at 1.5 parts per hundred resin (phr), 1.9 phr of Varox curing agent, and the filler and filler contents indicated in the Table.

The results in Table 3 illustrate that with a selected polymer composition of this invention, low Z CTE, low loss and good copper bond, even to low profile copper (SQ-VLP) is achieved. Example E, with the highest filler loading, shows the lowest loss and lowest CTE with low water absorption and good copper bond.

Dielectric layers for circuit subassemblies were prepared using the dielectric composition as set forth in Table 4, providing examples of halogen-free flame retardant compositions are provided in Table 4. The same polymer composition of Table 3 was used in the Examples of Table 4, i.e. a 2/1/1/ weight ratio of Noryl 640-11 PPE, Kraton D1118 block copolymer and Ricon 184 MA-6 maleinated butadiene-styrene copolymer with Chimassorb 944 antioxidant at 1.5 phr. Several different flame retardants were evaluated with best results obtained with the combination of Kisuma 85N magnesium hydroxide filler and Budit 3141CA melamine polyphosphate.

TABLE 4

|  | Ex. F | Ex. G |
|---|---|---|
| Kisuma 85N magnesium hydroxide, phr | 158.50 | 152.00 |
| Budit 3141CA melamine polyphosophate, phr | 31.70 | 38.00 |
| Properties |  |  |
| Bond (½ oz MLS), pli | 3.36 | 3.89 |
| Solder (288° C., 10 sec/5x) | 2 Fail @ 4x | Pass |
| Z CTE (0-100° C./0-150° C.) | 53.0/52.3 | 71.4/70.2 |
| Ramp 5° C./min. |  |  |
| Dielectric Breakdown Strength, V/mil | 1689 | 1367 |
| UL 94 V-0 | Pass | Pass |
| Dk @ 2 GHz/10 GHz | 3.91/3.91 | 3.86/3.85 |
| Df @ 2 GHz/10 GHz | 0.0046/0.0047 | 0.0047/0.0056 |

The results show that the compositions of Example F and Example G pass the UL 94V-0 flame test while maintaining relatively low loss and good Z CTE.

Examples of higher dielectric constant film compositions for dielectric layers are provided in Table 5. To the base polymer composition in Tables 3 and 4 were added different high dielectric constant fillers, specifically, TiPure R101, a titania from DuPont having an estimated Dk of 100, Code 218, a strontium titanate from Ferro Corp. having an estimated Dk of 200-300 and angular barium nanotitanate from Dimat, Inc., having an estimated Dk of 37. The compositions shown also contain A-174 silane (OSi Specialties) and Varox Vul-Cup R curing agent (GEO Specialty Chemicals, Inc.).

TABLE 5

|  | Ex. H | Ex. I | Ex. J | Ex. K |
|---|---|---|---|---|
| TiPure R101 titanium dioxide, vol % | 45 |  |  |  |
| Code 218 strontium titanate, vol % |  | 40 |  |  |
| Angular BNT (barium nanotitanate), vol % |  |  | 40 | 50 |
| Properties |  |  |  |  |
| Bond (½ oz SQ-VLP), pli | 3.7 | 4.0 | 5.8 | 5.7 |
| Solder (288° C., 10 sec/5x) | Pass | Pass | Pass | Pass |
| Z CTE (0-100° C./0-150° C.) |  | 29.8/42.9 |  | 30.1/31.9 |
| Water Absorption, wt % | 0.18 | 0.16 |  | 0.12 |
| Dk @ 2 GHz/10 GHz | 9.20/9.27 | 10.84/11.01 | 7.02/7.11 | 8.84/8.95 |
| Df @ 2 GHz/10 GHz | 0.0045/0.0048 | 0.0046/0.0047 | 0.0042/0.0040 | 0.0030/0.0024 |

The results in Table 5 indicate that with such a polymeric composition, dielectric film layers having a Dk at 2 and 10 GHz of ~11 with low CTE and good copper bond can be produced. In one case, Example K, a Dk=~9 was achieved with a very low Df of 0.0024 at 10 GHz.

The singular forms "a," "an," and "the" include plural referents unless the context clearly dictates otherwise. The endpoints of all ranges directed to the same characteristic or component are independently combinable and inclusive of the recited endpoint. All references are incorporated herein by reference. As used herein and throughout, "disposed," "contacted," and variants thereof refers to the complete or partial physical contact between the respective materials, substrates, layers, films, and the like. Further, the terms "first," "second," and the like herein do not denote any order, quantity, or importance, but rather are used to distinguish one element from another.

While specific embodiments have been shown and described, various modifications and substitutions can be made thereto without departing from the spirit and scope of the invention. Accordingly, it is to be understood that the present invention has been described by way of illustration and not limitation.

What is claimed is:

1. A circuit subassembly, comprising:
   a core, wherein the core comprises
      a core dielectric substrate layer having a first surface and an opposite second surface, wherein the composition of said core dielectric substrate layer is based on 1,2-polybutadiene, polytetrafluoroethylene, or a liquid crystal polymer; and
      a first core wiring layer disposed on the first surface of the dielectric substrate layer; and
   a dielectric layer having a thickness of about 5 to about 100 micrometers disposed on the first core wiring layer, wherein the dielectric layer is formed from a dielectric composition comprising, based on the total volume of the composition:
      about 15 to about 65 volume percent of a dielectric filler; and
      about 35 to about 85 volume percent of a thermosetting composition comprising:
         an unmodified poly(arylene ether), and
         a carboxy-functionalized polybutadiene or polyisoprene polymer.

2. The circuit subassembly of claim 1, wherein the dielectric filler in present in an amount of about 30 to about 60 volume percent of the dielectric composition and the thermosetting composition comprises 30 to 50 weight percent of an unmodified poly(arylene ether), 20 to 40 weight percent of a carboxy-functionalized polybutadiene or polyisoprene polymer, and 20 to 40 weight percent of an elastomeric block copolymer.

3. The circuit subassembly of claim 1, wherein the dielectric composition is halogen free and passes UL94 V0 testing in the absence of halogenated flame retardants.

4. The circuit subassembly of claim 1, wherein the dielectric filler comprises at least one of silica, titania, magnesium hydroxide, strontium titanate, barium titanate, $Ba_2Ti_9O_{20}$, boron nitride, aluminum nitride, and alumina.

5. The circuit subassembly of claim 1, wherein the dielectric composition further comprises an additional poly(arylene ether) that is carboxy-functionalized.

6. The circuit subassembly of claim 5, wherein the additional poly(arylene ether) is the reaction product of a poly(arylene ether) and a cyclic anhydride.

7. The circuit subassembly of claim 6, wherein the additional poly(arylene ether) is the reaction product of a poly(arylene ether) and maleic anhydride.

8. The circuit subassembly of claim 1, wherein the polybutadiene or polyisoprene polymer in the dielectric composition is the reaction product of a polybutadiene or polyisoprene polymer and a cyclic anhydride.

9. The circuit subassembly of claim 8, wherein the polybutadiene or polyisoprene polymer is a maleinized polybutadiene-styrene or maleinized polyisoprene-styrene copolymer.

10. The circuit subassembly of claim 1, wherein the dielectric composition comprises about 20 to about 89 wt % of the poly(arylene ether) and about 1 to about 80 wt % of the polybutadiene or polyisoprene polymer, each based on the combined weight of the poly(arylene ether) and the polybutadiene or polyisoprene polymer.

11. The circuit subassembly of claim 1, wherein the dielectric composition further comprises an elastomeric block copolymer comprises units derived from an alkenyl aromatic compound and a conjugated diene.

12. The circuit subassembly of claim 11, wherein the alkenyl aromatic compound is styrene and the conjugated diene is polybutadiene.

13. The circuit subassembly of claim 11, wherein the elastomeric block copolymer is styrene-butadiene diblock copolymer, styrene-butadiene-styrene triblock copolymer, styrene-isoprene diblock copolymer, styrene-isoprene-styrene triblock copolymer, styrene-(ethylene-butylene)-styrene triblock copolymer, styrene-(ethylene-propylene)-styrene triblock copolymer, styrene-(ethylene-butylene) diblock copolymer, or a combination comprising at least one of the foregoing copolymers.

14. The circuit subassembly of claim 11, wherein the block copolymer is a styrene-butadiene diblock copolymer, styrene-butadiene-styrene triblock copolymer, or a combination comprising at least one of the foregoing copolymers.

15. The circuit subassembly of claim 11, wherein the block copolymer is a combination of styrene-butadiene diblock copolymer and styrene-butadiene-styrene triblock copolymer.

16. The circuit subassembly of claim 1, wherein the core further comprises a second core wiring layer disposed on the second surface of the dielectric substrate layer, and a second dielectric layer is disposed on the second core wiring layer, wherein the second dielectric layer is formed from the dielectric composition.

17. The circuit subassembly of claim 1, wherein the composition of the core dielectric substrate layer is based on a 1,2-polybutadiene resin.

18. The circuit subassembly of claim 1, wherein the composition of the core dielectric substrate layer is based on polytetrafluoroethylene.

19. The circuit subassembly of claim 1, wherein the composition of the core dielectric substrate layer is based on liquid crystal polymer.

20. A circuit subassembly, comprising:
   a core, wherein the core comprises
      a core dielectric substrate layer having a first surface and an opposite second surface, wherein the composition of said core dielectric substrate layer is based on 1,2-polybutadiene, polytetrafluoroethylene, or a liquid crystal polymer; and
      a first core wiring layer disposed on the first surface of the dielectric substrate layer; and
   multiple dielectric layers, including a first dielectric layer, having a thickness of about 5 to about 100 micrometers disposed on the first core wiring layer, wherein the dielectric layer is formed from a dielectric composition comprising, based on the total volume of the composition:
about 15 to about 65 volume percent of a dielectric filler; and
about 35 to about 85 volume percent of a thermosetting composition comprising:
an unmodified poly(arylene ether), and
a carboxy-functionalized polybutadiene or polyisoprene polymer;
wherein the dielectric composition further comprises 10 to 40 wt. % based on the total weight of the thermosetting composition, of an elastomeric block copolymer comprising units derived from an alkenyl aromatic compound and a conjugated diene.

21. A circuit subassembly, comprising:
a core, wherein the core comprises
a core dielectric substrate layer having a first surface and an opposite second surface, wherein the composition of said core dielectric substrate layer is based on 1,2-polybutadiene, polytetrafluoroethylene, or a liquid crystal polymer; and
a first core wiring layer disposed on the first surface of the dielectric substrate layer; and
multiple dielectric layers, including a first dielectric layer, having a thickness of about 5 to about 100 micrometers disposed on the first core wiring layer, wherein the dielectric layer is formed from a halogen free dielectric composition comprising, based on the total volume of the composition:
about 15 to about 65 volume percent of a dielectric filler; and
about 35 to about 85 volume percent of a thermosetting composition comprising:
an unmodified poly(arylene ether), and
a carboxy-functionalized polybutadiene or polyisoprene polymer;
wherein the dielectric composition further comprises 10 to 40 wt. % based on the total weight of the thermosetting composition, of an elastomeric block copolymer comprising units derived from an alkenyl aromatic compound and a conjugated diene; and
a first wiring layer disposed on the first dielectric layer.

* * * * *